United States Patent

Ashmore, Jr. et al.

[19]

[11] Patent Number: 5,811,987
[45] Date of Patent: Sep. 22, 1998

[54] BLOCK CLOCK AND INITIALIZATION CIRCUIT FOR A COMPLEX HIGH DENSITY PLD

[75] Inventors: Benjamin Howard Ashmore, Jr.; Jeffery Mark Marshall, both of Austin, Tex.; Bryon Irwin Moyer, Cupertino, Calif.; John David Porter, Boise, Id.; Nicholas A. Schmitz, Sunnyvale; Bradley A. Sharpe-Geisler, San Jose, both of Calif.

[73] Assignee: Advanced Micro Devices, Inc., Sunnyvale, Calif.

[21] Appl. No.: 740,948

[22] Filed: Nov. 5, 1996

Related U.S. Application Data

[63] Continuation-in-part of Ser. No. 653,186, May 24, 1996, which is a continuation of Ser. No. 459,960, Jun. 2, 1995, Pat. No. 5,521,529, and Ser. No. 458,865, Jun. 2, 1995, Pat. No. 5,589,782.

[51] Int. Cl.$^6$ ...................................................... H03K 7/38
[52] U.S. Cl. ................................................. 326/39; 326/38
[58] Field of Search ................................... 326/39, 38, 40

[56] References Cited

U.S. PATENT DOCUMENTS 5,598,112  1/1997  Phillips ........................................ 326/39
5,670,896  9/1997  Diba et al. .................................. 326/39

*Primary Examiner*—Edward P. Westin
*Assistant Examiner*—Richard Roseen
*Attorney, Agent, or Firm*—Skjerven, Morrill, MacPherson, Franklin & Friel LLP; Forrest E. Gunnison

[57] ABSTRACT

A block clock and initialization circuit for a programmable logic block in a complex very high density programmable logic device generates a plurality of block clock signals and block initialization signals for elements in the programmable logic block. The block clock and initialization circuit includes a block clock generator circuit and a block initialization circuit. The block clock generator circuit receives a first set of product terms in a plurality of product terms and a plurality of clock signals as input signals. In response to the input signals, the block clock generator circuit generates output signals on a plurality of block clock lines. The block initialization circuit receives a second set of product terms in the plurality of product terms as input signals. In response to the input signals, the block initialization circuit generates a plurality of output signals on the block initialization lines.

50 Claims, 13 Drawing Sheets

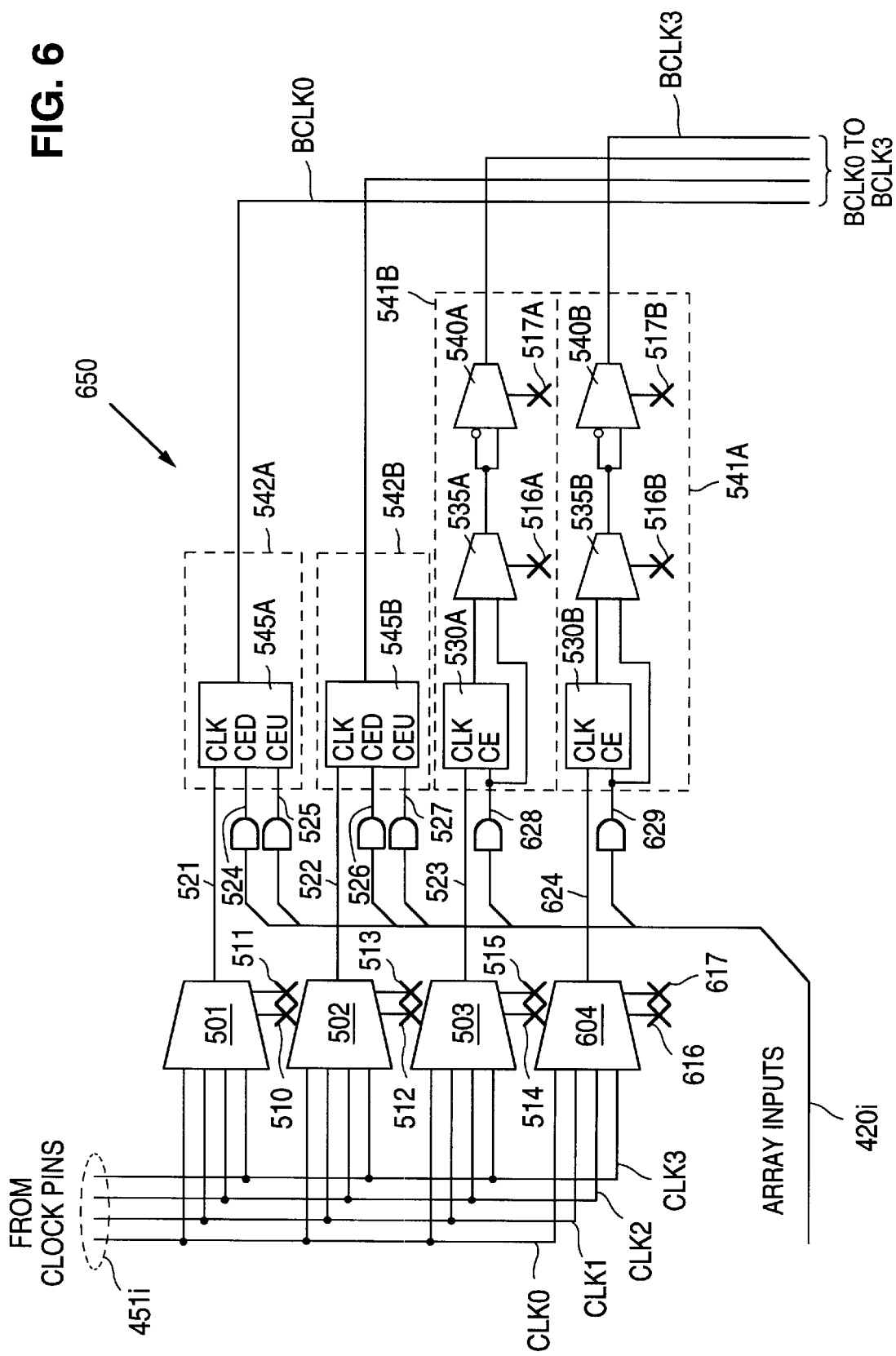

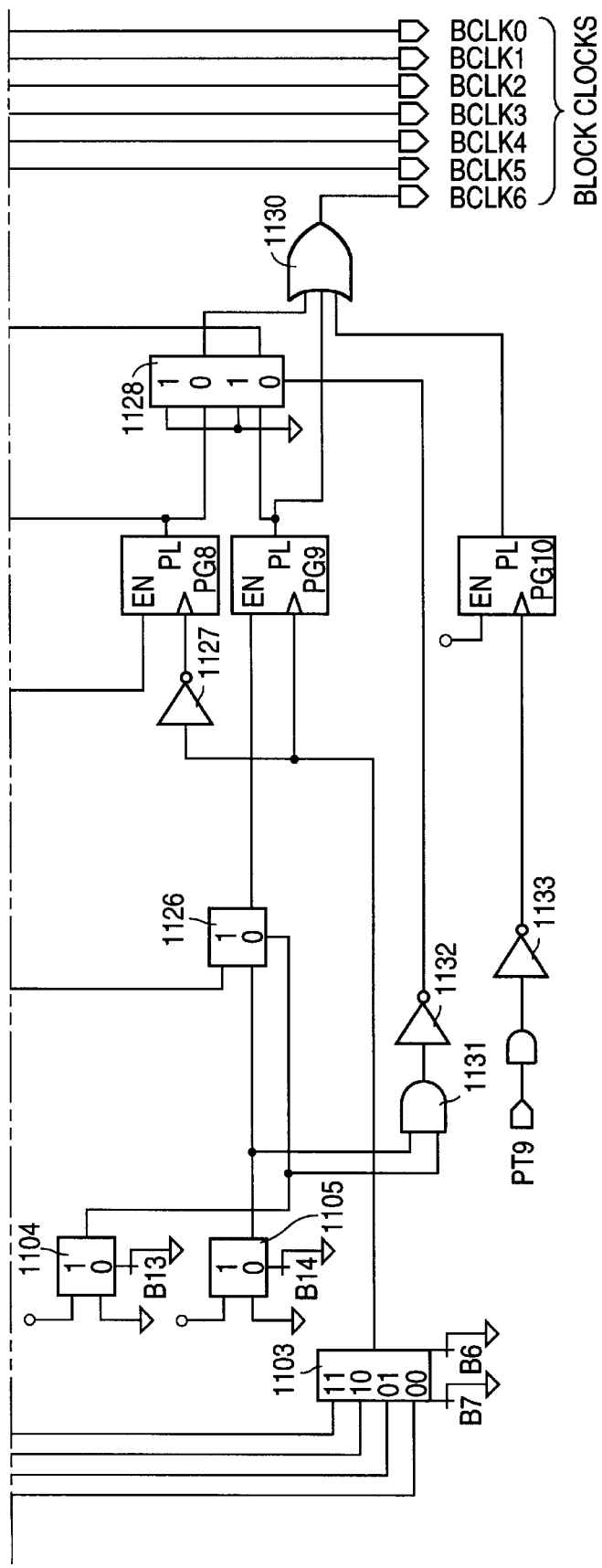
FIG. 11B
KEY TO FIG. 11
| FIG. 11A |
|---|
| FIG. 11A |

5,811,987

BLOCK CLOCK AND INITIALIZATION CIRCUIT FOR A COMPLEX HIGH DENSITY PLD

RELATED APPLICATIONS

This application is a continuation-in-part of commonly assigned U.S. patent application Ser. No. 08/653,186 entitled A METHOD FOR PROVIDING A PLURALITY OF HIERARCHICAL SIGNAL PATHS IN A VERY HIGH-DENSITY PROGRAMMABLE LOGIC DEVICE of Agrawal et al. filed on May 24, 1996, still pending, that was a continuation of U.S. patent application Ser. No. 08/459,960 entitled VERY HIGH-DENSITY COMPLEX PROGRAMMABLE LOGIC DEVICES WITH A MULTI-TIERED HIERARCHICAL SWITCH MATRIX AND OPTIMIZED FLEXIBLE LOGIC ALLOCATION of Agrawal et al. filed on Jun. 2, 1995, now U.S. Pat. No. 5,521,529, and U.S. patent application Ser. No. 08/458,865 entitled MACROCELL AND CLOCK SIGNAL ALLOCATION CIRCUIT FOR A PROGRAMMABLE LOGIC DEVICE (PLD) ENABLING PLD RESOURCES TO PROVIDE MULTIPLE FUNCTIONS of Bradley A. Sharpe-Geisler, filed on Jun. 2, 1995, now U.S. Pat. No. 5,589,782, each of which is incorporated herein by reference in its entirety.

FIELD OF THE INVENTION

This invention relates generally to programmable logic devices and in particular to clock generation and initialization circuits in programmable logic devices.

DESCRIPTION OF RELATED ART

Programmable logic device (PLD) designers have consistently sought to maximize logic utilization and to maximize logic density. One aspect that affects logic utilization and logic density is the generation of clock signals for a PLD. Typically, one or more of three levels, device, block, and macrocell, of clock generation are found in programmable logic devices.

When a device level clock signal is used, the device level clock signal is derived once for the entire complex programmable logic device (CPLD). Typically, the derivation of the device level clock signal involves nothing more than taking a signal 101 for a pin 105 of CPLD 100, and making signal 101 available throughout CPLD 100 as device level clock signal 150. Examples of PLDs that utilize device level clocks are given in U.S. Pat. No. 5,015,884 entitled MULTIPLE ARRAY HIGH PERFORMANCE PROGRAMMABLE LOGIC DEVICE FAMILY of Agrawal et al. issued on May 14, 1991 and U.S. Pat. No. 5,225,719 entitled FAMILY OF MULTIPLE SEGMENTED PROGRAMMABLE LOGIC BLOCKS INTERCONNECTED BY A HIGH SPEED CENTRALIZED SWITCH MATRIX of Agrawal et al. issued on Jul. 6, 1993, both of which are incorporated herein by reference in their entirety.

At the opposite extreme from a device level clock signal is a macrocell level clock signal that is generated at the macrocell level. For a macrocell level clock signal, each macrocell must include the capability for generating a clock signal that is available only to that macrocell. Examples of PLDs with a macrocell clock generation capability are given in U.S. Pat. No. 5,151,623 entitled PROGRAMMABLE LOGIC DEVICE WITH MULTIPLE FLEXIBLE ASYNCHRONOUS PROGRAMMABLE LOGIC BLOCKS INTERCONNECTED BY A HIGH SPEED SWITCH MATRIX of Agrawal issued on Sep. 29, 1992, that is incorporated herein by reference in its entirety.

A device level clock signal, sometimes called a global clock, can be used to clock multiple storage elements with no loss of logic utilization, whereas a product-term clock signal 210 in a CPLD 200, that is typically a macrocell level clock using existing implementations, is available only to a single storage element 215. If the same product-term-generated clock signal is needed on more than one storage element, either an extra macrocell must be used to generate a common signal, or the logic must be independently generated for each storage element that needs the clock. The former alternative hurts performance; the latter hurts utilization.

In the case of a standard global clock signal 150, the clock signal source is external to the device. In the case of the product-term-generated clock signal 210, the source is internal to the device, although the signals that are manipulated to generate the clock signal may be of external origin.

In between device level clock generation, and macrocell level clock generation is programmable block level clock generation. At this level, a block level clock signal is derived within a programmable logic block of the CPLD and is available throughout that block. Each programmable logic block may have a different mix of clock signals available within the block.

An example of a prior art block level clock generation circuit 350 is illustrated in FIG. 3. Global clock lines GCLK0 to GCLK3 receive signals directly from pins of the CPLD. Global clock line GCLK0 is connected to a terminal of two-to-one programmable multiplexer 301 and to an inverting terminal of two-to-one programmable multiplexer 302. Global clock line GCLK1 is connected to a terminal of two-to-one programmable multiplexer 302 and to an inverting terminal of two-to-one programmable multiplexer 301. Global clock line GCLK2 is connected to a terminal of two-to-one programmable multiplexer 303 and to an inverting terminal of two-to-one programmable multiplexer 304. Global clock line GCLK3 is connected to a terminal of two-to-one programmable multiplexer 304 and to an inverting terminal of two-to-one programmable multiplexer 303.

The signal passed through programmable multiplexer 301 by configuring architectural cell 311 drives block clock line BCLK0. The signal passed through programmable multiplexer 302 by configuring architectural cell 312 drives block clock line BCLK0.

The signal passed through programmable multiplexer 303 by configuring architectural cell 313 drives block clock line BCLK1. The signal passed through programmable multiplexer 304 by configuring architectural cell 314 drives block clock line BCLK2.

Block clock generator 350 allows for various combinations of true and complement clock signals to be provided on lines BCLK0 to BCLK3. However, not all combinations are possible. Although there are four clock lines BCLK0 to BCLK3, the selection of clock signals on some lines is affected by the selection of others; that is, the clock signals on the lines are not orthogonal. The clock signals on the top two lines, i.e, lines BCLK0 and BCLK1 together, are orthogonal to the clock signals on the bottom two lines, i.e., lines BCLK2 and BCLK3, but the top two clock signals on lines BCLK0 and BCLK1 are not orthogonal to each other, nor are the bottom two clock signals. This limits how otherwise independent clocks can be used in combination to clock potentially unrelated circuits.

Clock signals can be generated by logically combining other signals. These generally fall into two categories: one where a global clock signal is qualified, or gated, with other logic; and one where the logic involves no global clock signal. Note that the former case is more effectively implemented by clock enable (see above). The latter case comprises what is truly asynchronous behavior, since the clock signal has no relationship to any other clock signal. Because product-term clocks allow this asynchronous capability, the term product-term clock has become synonymous with asynchronous clock even in cases where its usage is not really asynchronous. The term "asynchronous" has other usages as well, adding further potential confusion.

From the standpoint of the electronic system designer, the scope of the clock signal, i.e., whether the clock signal is global or local, and the source of the clock signal, i.e., whether the clock signal is of internal or external origin, are two separate, orthogonal decisions. Whether a clock is asynchronous can depend on how the system designer views his or her system, and may or may not be related to the scope or source of the clocks. These concepts are interlinked artificially only by the implementations that have been available to date. Thus, the use of such terms as "global", "local", and "asynchronous" can be ambiguous.

To remove any potential for ambiguity throughout this disclosure the following terms are used:

Dedicated clock: a signal from a pin of the PLD whose primary function is to act as a clock signal; the signal may or may not also be available for use in a programmable logic array of the PLD;

Simple clock: a clock signal derived from a single external signal, e.g., a signal on a dedicated clock pin or and I/O pin, being either the true or complement version of that external signal, whether single-use or multiple-use;

Complex clock: a clock signal derived via logic manipulation of a number of external and/or internal signals, whether single-use or multiple-use;

Synchronized complex clock: a complex clock signal whose logic involves a dedicated clock signal;

Unsynchronized complex clock: a complex clock signal whose logic involves no dedicated clock signal;

Single-use clock: a clock signal, whether simple or complex, that is used to clock one storage element; and Multiple-use clock: a clock signal, whether simple or complex, that is used to clock more than one storage element.

Multiple combinations of clock signals can be generated using the prior art structures. However, as indicated above, there is a trade-off between clocking flexibility and logic utilization. Further, the speed performance of the CPLD can be affected by the particular implementation of the clock source. In addition, to provide more flexibility requires addition of more elements in the clock generation circuitry, which in turn decreases the silicon available for logic. A clock generation circuit that provides flexibility with a minimal number of components is needed.

SUMMARY OF THE INVENTION

According to the principles of this invention, a programmable logic device having a plurality of programmable logic blocks includes a block clock and initialization circuit that in turn includes a block clock generator and a block initialization circuit. The block clock generator is connected to a first set of product terms in a plurality of product terms, to clock signal input lines and a plurality of block clock lines. The block clock generator receives input signals on the clock signal input lines, and from the product terms, and generates at least one block clock signal on one of the plurality of block clock lines. The block initialization circuit is connected to a second set of product terms in the plurality of product terms and to a plurality of block initialization lines. The block initialization circuit receives an input signal from the second set of product terms and generates an output signal on one of the plurality of block initialization lines.

In this embodiment, each programmable logic block includes a block clock and initialization circuit, i.e., the block clock and initialization circuit and each circuit contained therein are a block-level circuit. Consequently, each programmable logic block is programmably configured to select a unique combination of block clock signals and block initialization signals for that block. This allows the partitioning of much more complex circuits than would be possible with device-level clock signals. The implementation is much more cost-effective than would be possible with macrocell-level clock and initialization signal generation.

The block clock generator circuit includes any one of, or a combination of a plurality of clock generation circuits. In one embodiment, the plurality of clock generation circuits includes a multi-function clock and product-term clock generation circuit, a dual enable biphase clock generation circuit, and a dual output multi-function clock generation circuit.

A multi-function clock and product-term clock generation circuit receives a clock signal on one of the plurality of clock input line and a product term, as input signals. The multi-function clock and product-term clock generation circuit is programmably configured to generate any one of the following clock signals on one of the plurality of block clock lines in response to the input signals:

i) an orthogonal block-level clock signal with a programmable polarity;

ii) an orthogonal block-level clock signal with clock enable and a programmable polarity;

iii) a block-level product-term clock signal; and iv) a block-level sum-term clock signal.

The dual enable biphase clock generation circuit receives a clock signal from one of the plurality of clock input lines and two product terms as input signals. The dual enable biphase clock generation circuit generates one of a plurality of clock signals on one of the plurality of block clock lines in response to the input signals. Specifically, the dual enable biphase clock generation circuit generates any one of:

i) an orthogonal standard clock signal with dynamic polarity control;

ii) a orthogonal biphase clock signal; and iii) any desired combination over time of an orthogonal standard clock signal with dynamic polarity control; and an orthogonal biphase clock signal.

The dual output multi-function clock generation circuit receives a clock signal on one of the plurality of clock input lines and a product term as input signals. The dual output multi-function clock generation circuit generates a first clock signal on one of the plurality of block clock lines, and a second clock signal on another one of the plurality of block clock lines.

In one embodiment, the dual output multi-function clock generation circuit generates on the first block clock line any one of:

i) an orthogonal block-level clock signal; and ii) an orthogonal block-level clock signal with clock enable.

The dual output multi-function clock generation circuit also generates, in this embodiment, on the second block clock line any one of:

i) an orthogonal block-level clock signal that has a polarity opposite the clock signal on the first block clock line;

ii) an orthogonal block-level clock signal, that has a polarity opposite the clock signal on the first block clock line with clock enable; and iii) a block-level product-term clock signal.

Thus, in this embodiment, in response to the plurality of product terms and the clock input signals, the block clock generator circuit can generate any of the following clock signals on the plurality of block clock lines:

Orthogonal block-level clock signals with programmable polarity;

Block-level clock signals with clock enable and programmable polarity;

Block-level product-term clock signals;

Biphase clock signals; and

Block-level sum-term clock signals.

In various embodiments of this invention, each capability or any combination of the capabilities are used. However, for an efficient implementation that minimizes duplicated resources, the combination of the five capabilities in a single circuit provides a highly effective block clock generator circuit.

The second set of product terms in the plurality of product terms is connected to input terminals of the programmable block initialization circuit. The second set of product terms is used to generate a plurality of independent block initialization signals for a programmable logic block. All signals in the plurality of block initialization signals are available throughout the programmable logic block. The available block initialization signals include programmably selectable product-term signals and sum-term signals.

In a CPLD, a particular set of block initialization signals can be generated for each programmable logic block, which in turn allows partitioning of much more complex circuits than would be possible with device-level initialization signals. The implementation is much more cost-effective than would be possible with macrocell-level initialization signal generation.

In one embodiment, a programmable logic device having a plurality of programmable logic blocks includes a block clock generator circuit comprising: a plurality of product terms; a plurality of clock signal input lines; a plurality of block clock signal lines coupled to a plurality of macrocells in one programmable logic block in the plurality of programmable logic blocks; and a programmable clock and product-term clock generation circuit.

The programmable clock and product-term generation circuit includes a first generator circuit input terminal connected to one of the plurality of clock signal input lines and a second generator circuit input terminal connected to one product term of the plurality of product terms.

A programmable polarity control element is coupled to the first and second generator circuit input terminals to receive an input signal, and has an output terminal connected to a generator circuit output line that is one of the plurality of block clock lines. The polarity control element is programmably configurable to pass one of the input signal and an inverse of the input signal to the generator circuit output line.

The programmable clock and product-term generation circuit also has a programmable signal selector with a first selector input terminal coupled to the first generator circuit input terminal and a second selector input terminal connected to the second generator circuit input terminal. A selector output line is connected to the programmable polarity control element to provide the input signal. The programmable signal selector selectively connects one selector input terminal to the selector output line, and disconnects one other selector input terminal from the selector output line.

The programmable clock and product-term generation circuit further includes a clock generator having a clock terminal connected to the first generator circuit input terminal and a clock enable terminal connected to the second generator circuit input terminal. An output terminal of the clock generator is connected to the programmable signal selector first input terminal. The clock generator generates a clock pulse on the output terminal only when a signal on the clock enable terminal has a first state.

In another embodiment of this invention, a method of generating a block clock signal includes coupling a clock signal source having first and second edges to an input terminal of a clock generation circuit. The clock generation circuit also includes a first clock enable terminal, a second clock enable terminal, and an output terminal.

In this method, a first product term is coupled to the first clock enable terminal and upon the first product term having a first state, a clock pulse is generated on the output terminal in response to each first edge on the input terminal. However, upon the first product term having a second state, no clock pulse is generated on the output terminal in response to each first edge on the input terminal.

Also in this method, a second product term is coupled to the second clock enable terminal, and upon the second product term having a first state, a clock pulse is generated on the output terminal in response to each second edge on the input terminal. However, upon the second product term having a second state, no clock pulse is generated on the output terminal in response to each second edge on the input terminal.

In yet another embodiment of this invention, a programmable logic device includes a block clock generator circuit, and a plurality of block clock lines coupled to a plurality of macrocells in one programmable logic block in a plurality of programmable logic blocks with a programmable dual output clock generation circuit driving two of the block clock lines. The programmable dual output clock generation circuit has a first generation circuit input terminal connected to a clock signal input line and a second generation circuit terminal coupled to a product term. A first generation circuit output terminal is connected to a first block clock line, and coupled to a second block clock line.

In one embodiment, the dual output clock generation circuit has a programmable signal selector with a first selector input terminal coupled to the first generation circuit input terminal and a second selector input terminal connected to the second generation circuit input terminal. A programmable signal selector output line is connected to the second block clock signal line. The programmable signal selector selectively connects one selector input terminal to the selector output line, and disconnects one other selector input terminal from the selector output line.

In this embodiment, a clock generator has a clock terminal connected to the first generation circuit input terminal and a clock enable terminal connected to the second generation circuit input terminal. A clock generator output terminal is connected to the first selector input terminal and to the generation circuit output terminal. The clock generator generates a clock pulse on the clock generator output terminal only when a signal on the clock enable terminal has a first state.

In another embodiment, the dual output clock generation circuit has a inverter with an inverter input terminal coupled to the first generation circuit input terminal and an inverter output line is connected to the second block clock line. A clock generator has a clock terminal connected to the first generation circuit input terminal; a clock enable terminal connected to the second generation circuit input terminal; and a clock generator output terminal connected to the inverter input terminal and to the generation circuit output terminal. The clock generator generates a clock pulse on the clock generator output terminal only when a signal on the clock enable terminal has a first state.

The programmable logic device of this invention also includes a block initialization circuit with a plurality of block initialization lines coupled to a plurality of macrocells in one programmable logic block in a plurality of programmable logic blocks. The programmable initialization circuit has a plurality of input terminals coupled to the second set of product terms in the plurality of product terms. A first output terminal is coupled to a first input terminal in the plurality of input terminals to receive the product term coupled to the first input terminal, and connected to a first block initialization line in the plurality of block initialization lines. A second output terminal is coupled to a second input terminal in the plurality of input terminals to receive one of the product term and the inverse of the product term coupled to the second input terminal, and connected to a second block initialization line in the plurality of block initialization lines.

BRIEF DESCRIPTION OF THE DRAWINGS

FIG. 6 is a diagram of another embodiment of the block clock generator circuit of this invention.

DETAILED DESCRIPTION

A novel programmable block clock generator circuit of this invention provides a new level of performance and logic utilization in a complex programmable logic device 400. In this embodiment, CPLD 400 includes a plurality of programmable logic blocks 410A to 410D that are coupled together through a programmable switch matrix 490.

Each programmable logic block 410A to 410D in CPLD 400 includes a programmable logic array 415$i$, where i=A, B, C, D, that includes a plurality of input lines programmably connected to and disconnected from each of a plurality of product terms; a plurality of macrocells 440$i$ programmably coupled to and decoupled from the product terms in programmable logic array 415$i$; a plurality of I/O cells 460$i$ coupled to at least some of the plurality of macrocells; and a plurality of I/O pins 465$i$ connected to the plurality of I/O cells 460$i$. In this embodiment, I/O cells 460$i$ and macrocells 440$i$ provide feedback signals to programmable switch matrix 490.

A CPLD architecture, programmable logic block architecture and programmable switch matrix structure suitable for use in this invention are illustrated in U.S. Pat. No. 5,521,529 entitled VERY HIGH-DENSITY COMPLEX PROGRAMMABLE LOGIC DEVICES WITH A MULTI-TIERED HIERARCHICAL SWITCH MATRIX AND OPTIMIZED FLEXIBLE LOGIC ALLOCATION of Agrawal et al. issued on May 28, 1996, which is incorporated herein by reference in its entirety.

Figure 1:
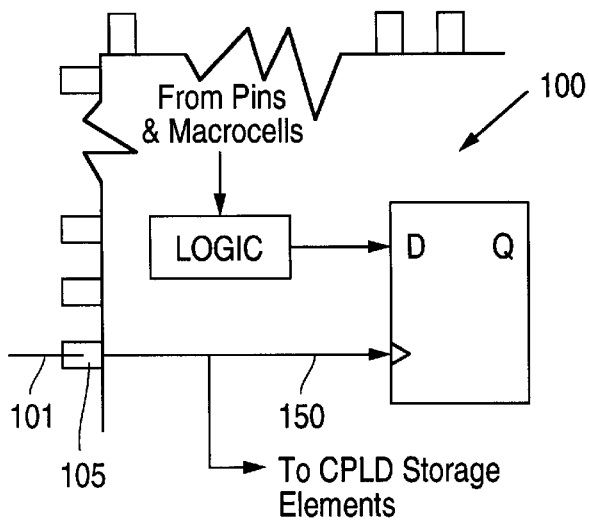
FIG. 1 is a diagram that illustrates global clock signal routing in a prior art device.
Figure 2:
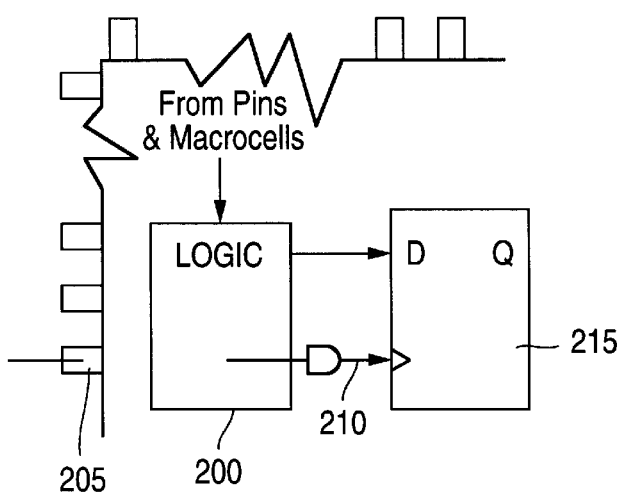
FIG. 2 is a diagram that illustrates a prior macrocell level clock signal.
Figure 3:
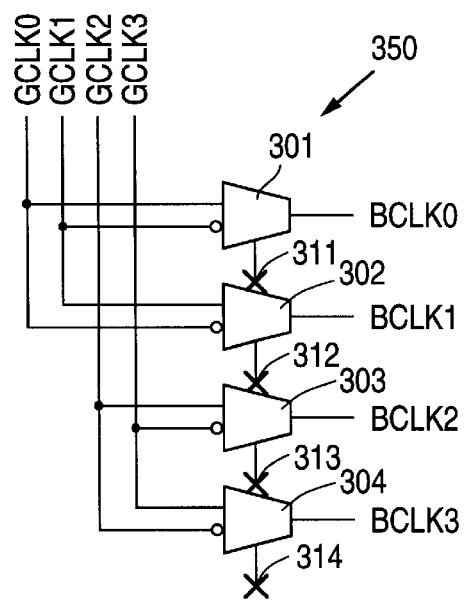
FIG. 3 is a schematic diagram of a prior art block clock generator circuit.
Figure 4:
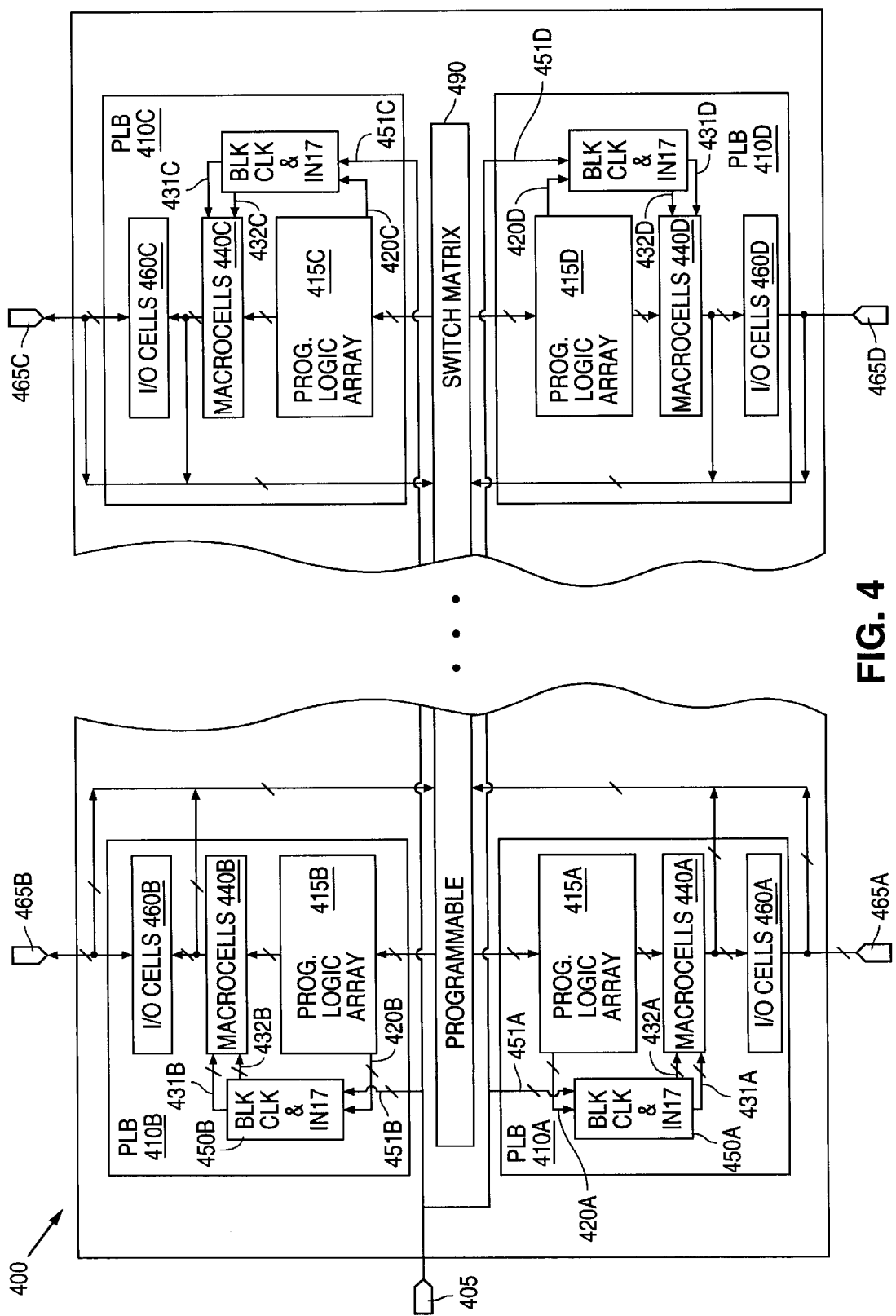
FIG. 4 is high level diagram of a complex very high density programmable logic device that includes the block clock and initialization circuit of this invention.

Each programmable logic block 410A to 410D in CPLD 400 also includes a programmable block clock and initialization circuit 450A to 450D, respectively. Each block clock and initialization circuit 450$i$, where i=A, B, C, D, receives a plurality of global clock signals from clock pins 405 of CPLD 400 over lines 451$i$, and another plurality of logic signals, in one embodiment, dedicated logic signals, on a plurality of logic signal lines 420$i$, e.g., in one embodiment, a plurality of product terms from a programmable logic array 415$i$ in programmable logic block 410$i$. Herein, the particular technique used to route the global clock signals to a programmable block clock and initialization circuit 450$i$ is not a critical aspect of this invention. The global clock signals can be routed over a dedicated bus 451 as illustrated in FIG. 4, or alternatively routed through programmable switch matrix 490, for example.

Using the two pluralities of input signals, programmable block clock and initialization circuit 450$i$ generates a plurality of independent, i.e, orthogonal, block clock signals on block clock lines 431$i$ and a plurality of independent block initialization signals on block initialization lines 432$i$. All clock signals on block clock lines 431$i$ and all initialization signals on block initialization lines 432$i$ are available throughout programmable logic block 410$i$. The particular programmable method used to couple block clock lines 431$i$ and block initialization lines 432$i$ to a particular macrocell or I/O cell, and used to select one or more of the signals for use are not an essential feature of this invention.

Each programmable logic block 410$i$ is programmably configured to select a unique combination of block clock signals and a unique combination of block initialization signals for that block. This allows the partitioning of much more complex circuits than would be possible with device-level clock signals. The implementation is much more cost-effective than would be possible with macrocell-level clock and initialization signal generation. Further, each macrocell in a block can independently select clock and initialization signals from the block-level signals within its block.

In this embodiment, programmable block clock and initialization circuit 450i includes a programmable block clock generator circuit 550 that drives block clock lines 431i and a programmable block initialization circuit 560 (FIG. 5A) that drives block initialization lines 432i. The global clock signals on global clock lines 451i are coupled to programmable block clock generator circuit 500 by a programmable global clock selector circuit 505.

In this embodiment, a plurality of clock input lines, e.g., lines 521 to 523, of programmable block clock generator circuit 550 are connected to output terminals of global clock selector circuit 505. For each output terminal of global clock selector circuit 505, circuit 505 programmably couples one of the global clock lines to the output terminal and decouples all other global clock lines from that output terminal. A first plurality, e.g. product terms 524 to 527, of product terms 420i are connected to input terminals of block clock generator circuit 550.

In this embodiment, block clock generator circuit 550 includes a plurality of clock generation circuits, e.g., a multi-function clock and product-term clock generation circuit 541, a dual enable biphase clock generation circuit 542, and a dual output multi-function clock generation circuit 543. This combination of circuits within block clock generator circuit 550 is illustrative only of the principles of this invention and is not intended to limit the invention to the specific combination of circuits described. A variety of combinations of circuits and modifications within a particular circuit will be apparent to those of skill in the art in view of the following disclosure.

Multi-function clock and product-term clock generation circuit 541 of block clock generator 550 receives a clock signal on clock input line 521 and a product term 524 as input signals. Multi-function clock and product-term clock generation circuit 541 is programmably configured, as explained more completely below, to generate any one of the following clock signals on block clock line BCLK0:

i) an orthogonal block-level clock signal with a programmable polarity;
ii) an orthogonal block-level clock signal with clock enable and a programmable polarity;
iii) a block-level product-term clock signal; and
iv) a block-level sum-term clock signal.

Dual enable biphase clock generation circuit 542 in programmable block clock generator circuit 550 receives a clock signal on clock input line 522 and two product terms 525 and 526 as input signals. Dual enable biphase clock generation circuit 542 generates one of a plurality of clock signals on block clock line BCLK1. As explained more completely, dual enable biphase clock generation circuit 542 generates any one of:

i) an orthogonal standard clock signal with dynamic polarity control;
ii) a orthogonal biphase clock signal; and
iii) any desired combination over time of an orthogonal standard clock signal with dynamic polarity control; and an orthogonal biphase clock signal.

Programmable block clock and initialization circuit 450i also includes a dual output multi-function clock generation circuit 543 that receives an input clock signal on clock input line 523 and product term 527. Dual output multi-function clock generation circuit 543 generates a first clock signal on block clock line BCLK2, and a second clock signal on block clock line BCLK3. The clock signals on block clock lines BCLK2 and BCLK3 are orthogonal to clock signals on block clock lines BCLK0 and BCLK1, but are not necessarily orthogonal to each other.

In this embodiment, dual output multi-function clock generation circuit 543 generates, as explained more completely below, on block clock line BCLK2 any one of:

i) an orthogonal block-level clock signal; and
ii) an orthogonal block-level clock signal with dynamic clock enable.

Dual output multi-function clock generation circuit 543 also generates, as explained more completely below, on block clock line BCLK3 any one of:

i) an orthogonal block-level clock signal that has a polarity opposite the clock signal on block clock line BCLK2;
ii) an orthogonal block-level clock signal, that has a polarity opposite the clock signal on block clock line BCLK2 with dynamic clock enable; and
iii) a block-level product-term clock signal.

Thus, in this embodiment, in response to the plurality of product terms and the clock input signals, block clock generator circuit 550 can generate any of the clock signals given in Table 1.

TABLE 1

Block Clock Generator Circuit 550 Capabilities

Orthogonal block-level clock signals with programmable polarity
Block-level clock signals with clock enable and programmable polarity
Block-level product-term clock signals
Biphase clock signals
Block-level sum-term clock signals In various embodiments of this invention, each capability or any combination of the capabilities are used. However, for an efficient implementation that minimizes duplicated resources, the combination of the five capabilities in a single circuit provides a highly effective block clock generator circuit 550.

A second plurality of product terms, e.g., product terms 561 to 563, are connected to input terminals of programmable block initialization circuit 560. The three product terms 561 to 563 are used to generate three independent initialization signals for a programmable logic block. All three initialization signals are available throughout the programmable logic block. The available initialization signals include programmably selectable product-term signals and sum-term signals.

In a CPLD, a particular set of initialization signals can be generated for each programmable logic block, which in turn allows partitioning of much more complex circuits than would be possible with device-level initialization signals. The implementation is much more cost-effective than would be possible with macrocell-level initialization signal generation.

Herein, initialization is a general term that includes both set (or preset) and reset (or clear) functions on a register. These functions are used to set an initial value for the register, and so provide a known starting point of operation. However, the block level initialization signals of this invention could be used for other initialization operations. Since the initialization signals are driven by product terms, the initialization is dynamic and could be controlled for example by a state machine.

Figure 5A:
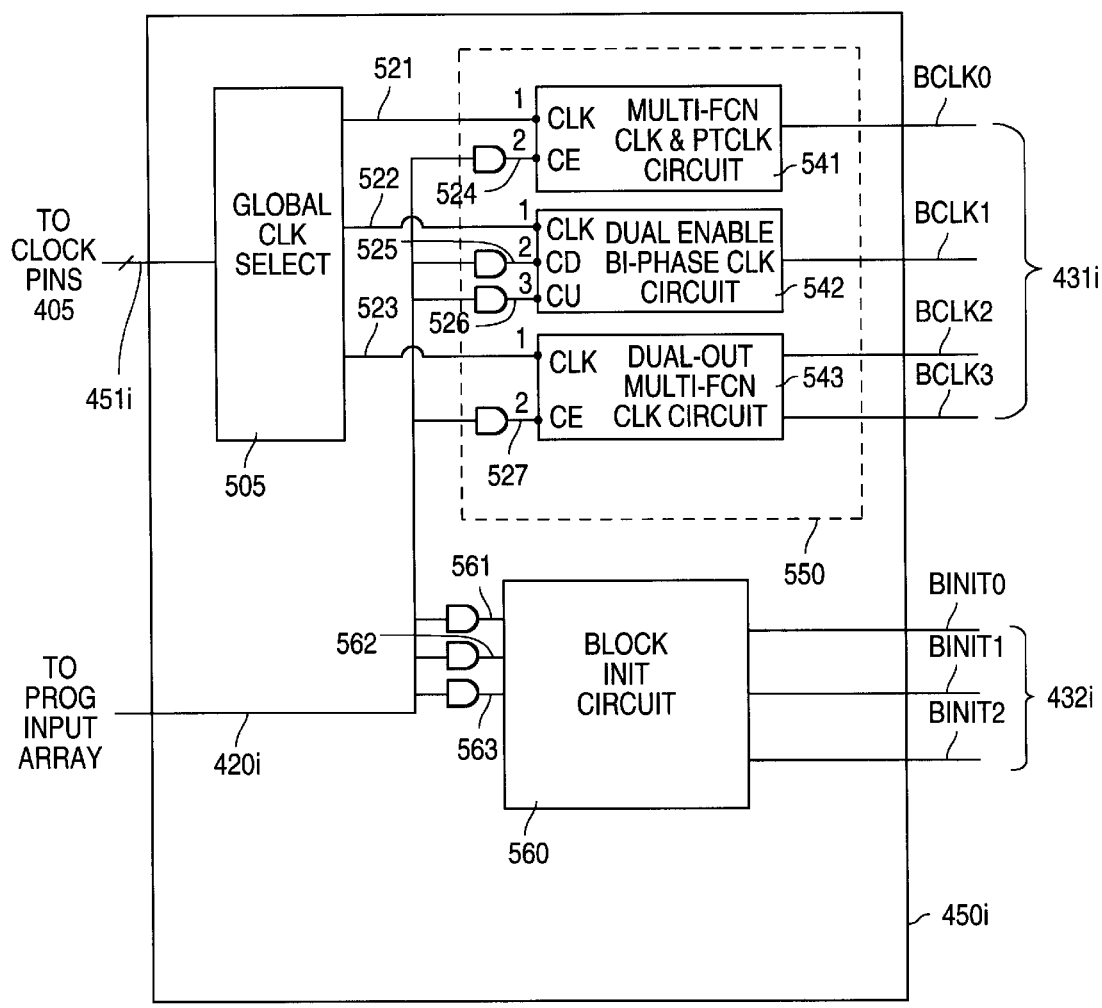
FIG. 5A is a block diagram of the block clock and initialization circuit of this invention that illustrates the block clock generator and block initialization circuit.
Figure 5D:
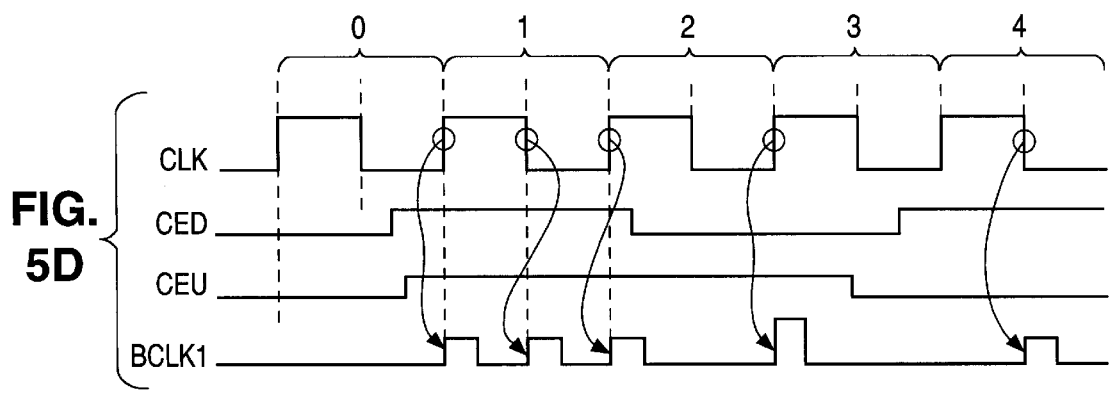
FIG. 5D is a timing diagram that illustrates the functionality of the dual enable biphase clock generator circuit of this invention.
Figure 5B:
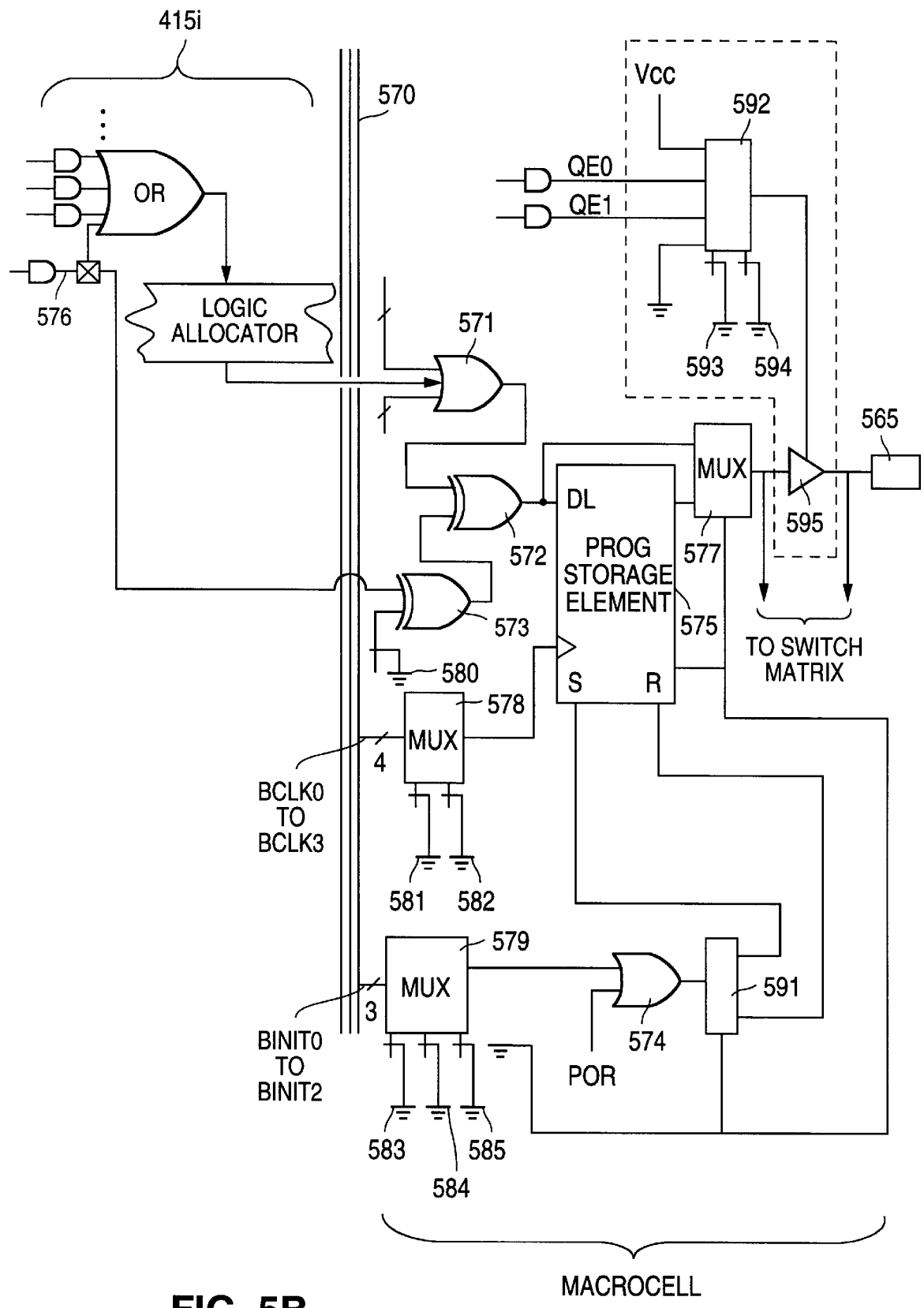
FIG. 5B is a diagram of one embodiment of a programmable logic macrocell that utilizes the block clock and block initialization signals of this invention.

FIG. 5B is a more detailed diagram of one macrocell in the plurality of macrocells 440i and one I/O cell in the plurality of I/O cells 460i. Control bus 570 includes block clock lines BCLK0 to BCLK3, block initialization lines BINIT0 to BINIT2, and two block output enable product terms OE0 and OE1. A input signal from a logic allocator output terminal drives a first input terminal of OR gate 571. The other input terminals of OR gate 571 are connected to other output terminals of the logic allocator. The configuration of the logic allocator and OR gate 571 are not essential to this invention.

An output signal of OR gate 571 drives a first input terminal of a first exclusive OR gate 572. A second input terminal of exclusive OR gate 572 is driven by an output signal from a second exclusive OR gate 573.

A first input terminal of exclusive OR gate 573 is driven by a programmably routed product term 576. A second input terminal of exclusive OR gate 573 is connected to a programmable architecture cell 580.

The output signal from exclusive OR gate 572 drives a D/L input terminal of a programmable storage element 575 and a first input terminal of a programmable multiplexer 577. A second input terminal of programmable multiplexer 577 is driven by the signal on the output terminal of programmable storage element 575. In this embodiment, programmable storage element 575 is programmably configured as one of a D-type flip-flop and a latch using architectural cells 583 to 585, as described more completely below.

Each of block clock lines BCLK0 to BCLK3 is connected to a different input terminal of a four-to-one programmable multiplexer 578. The block clock signal passed through programmable multiplexer 578 is determined by architectural cells 581 and 582. The output signal of programmable multiplexer drives a clock terminal of programmable storage element 575.

Each of block initialization lines BINIT0 to BINIT2 is connected to a different input terminal of a three-to-one programmable multiplexer 579. The block initialization signal passed through programmable multiplexer is determined by architectural cells 583 to 585.

The output signal of programmable multiplexer 579 drives a first input terminal of OR gate 574. A second input terminal of OR gate 574 is driven by a power-on-reset signal on line POR. The output signal from OR gate 574 drives an input terminal of a one-to-two programmable demultiplexer 591. A first output line of programmable demultiplexer 591 is connected to a set terminal S of programmable storage element 575. A second output line of programmable demultiplexer 591 is connected to a reset terminal R of programmable storage element 575.

The operation of programmable demultiplexer 591 is controlled by architectural cells 583 to 585 as is programmable storage element 575 and combinatorial/registered programmable multiplexer 577. One embodiment of the various programmable configurations of the macrocell defined by architectural cells 583 to 585 is given in Table 2. Table 2 is illustrative only of one embodiment of the invention and is not intended to limit the invention to the specific configurations presented.

TABLE 2

| Arch. Cell 583 State | Arch. Cell 584 State | Arch. Cell 585 State | Mux 579 Output Signal and Terminal; Programmable Storage Element; and Macrocell Signal Output Type. |
|---|---|---|---|
| 0 | 0 | 0 | BINIT0 to terminal R D-type flip-flop Register Output signal |
| 0 | 0 | 1 | BINT1 to terminal R D-type flip-flop Register Output signal |
| 0 | 1 | 0 | BINIT2 to terminal R D-type flip-flop Register Output signal |
| 0 | 1 | 1 | BINIT2 to latch enable Latch Latch output signal |
| 1 | 0 | 0 | BINIT0 to terminal S D-type flip-flop Register Output signal |
| 1 | 0 | 1 | BINIT1 to terminal S D-type flip-flop Register Output signal |
| 1 | 1 | 0 | BINIT2 to terminal S D-type flip-flop Register Output signal |
| 1 | 1 | 1 | — — Combinatorial Output Signal |

The output signal from programmable multiplexer 577 drives an input terminal of a three-state buffer 595 of the I/O cell and a first feedback line. An output enable terminal of three-state buffer 595 is connected to an output terminal of an I/O cell four-to-one programmable multiplexer 592 that is configured with architectural cells 593 and 594. Programmable multiplexer 592 receives a logic one, a logic zero and output enable product terms OE0 and OE1 as input signals. The output terminal of three-state buffer 595 drives an I/O pin 565 and a second feedback line.

The particular configuration and operation of the macrocell and of the I/O cell presented in FIG. 5B are not essential to this invention. The macrocell is presented to illustrate one embodiment for using block clock and block initialization signals that are generated by the circuits of this invention.

FIGS. 5C to 10 illustrate several alternative embodiments of this invention that include some or all of the capabilities presented in Table 1. These embodiments are illustrative only and are not intended to limit the invention to the specific embodiments described. For example, as explained more completely below, if a sum-term is needed for a clock enable function, the product term to the particular clock enable terminal could be inverted.

Figure 5C:
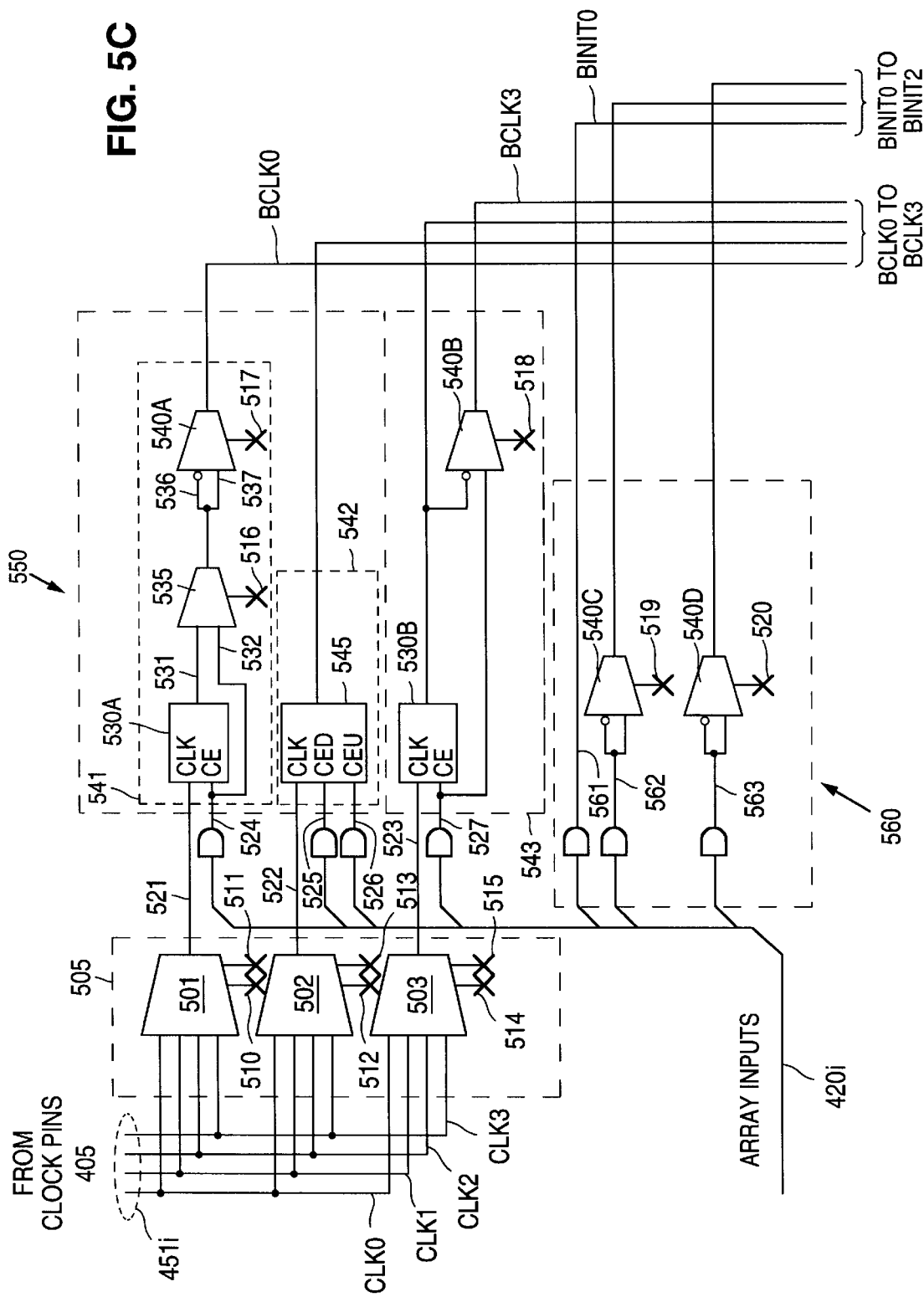
FIG. 5C is a more detailed diagram of one embodiment of a block clock generator circuit and a block initialization circuit in the block clock and initialization circuit of this invention.
Figure 7:
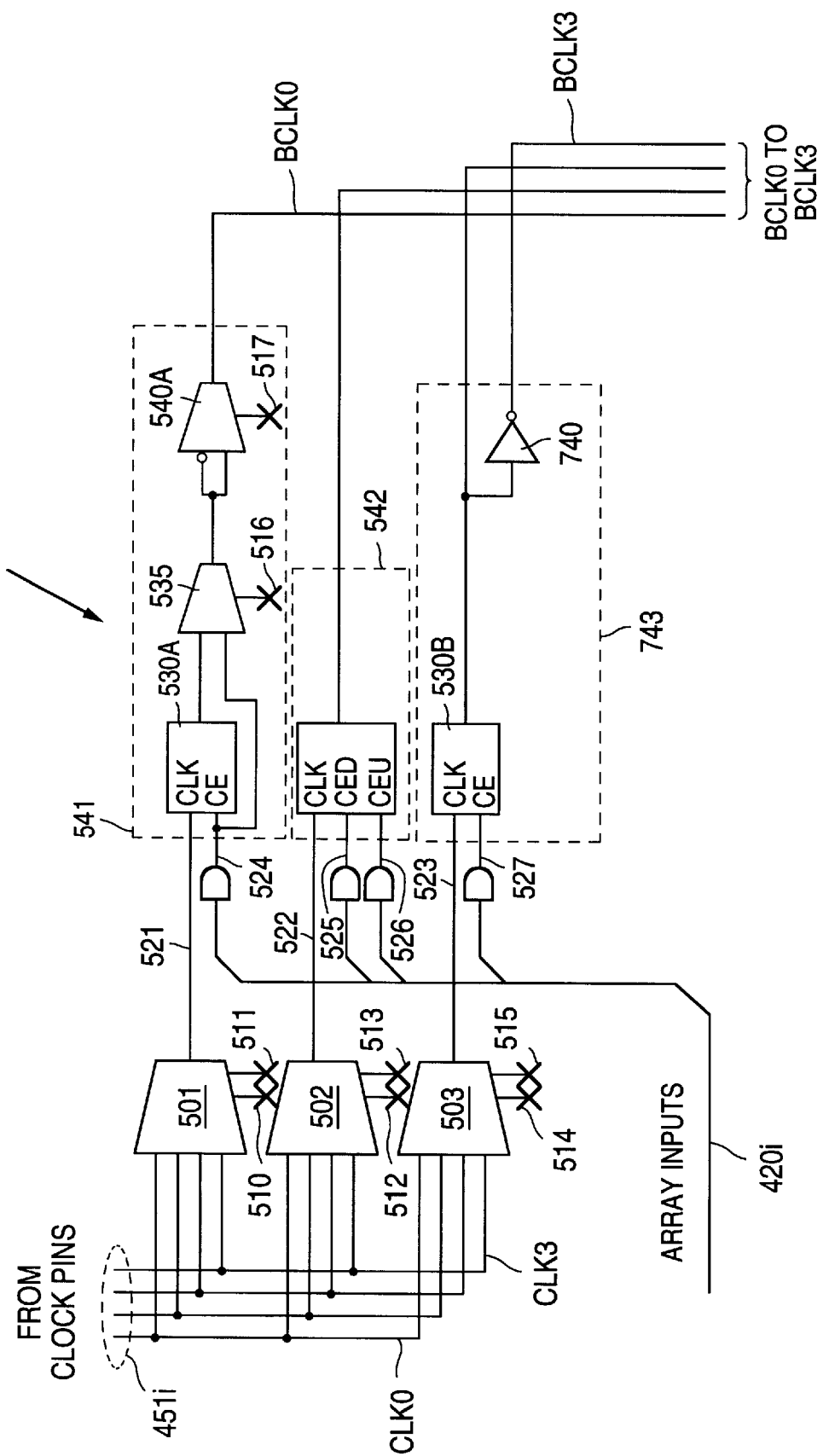
FIG. 7 is a diagram of yet another embodiment of the block clock generator circuit of this invention.
Figure 8:
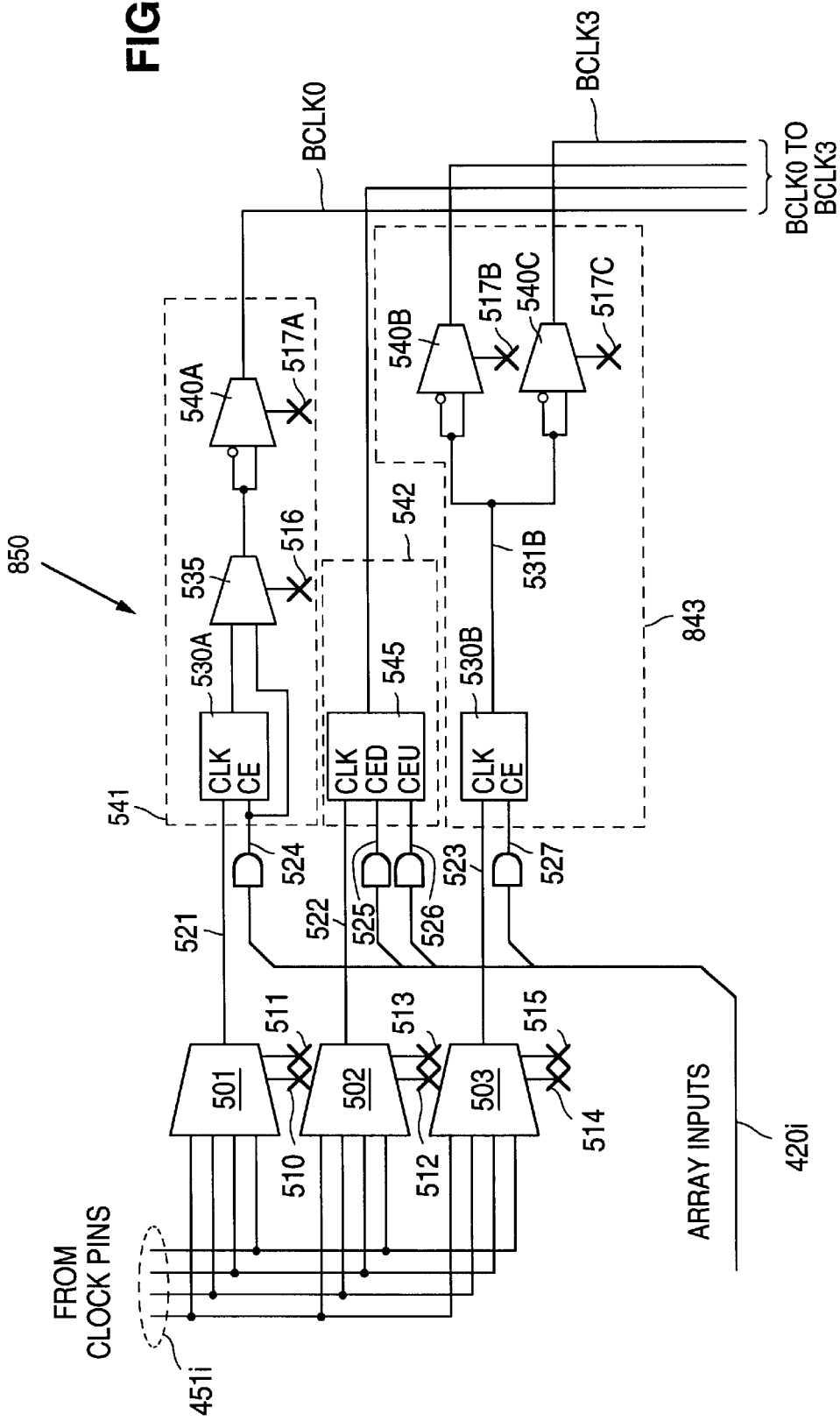
FIG. 8 is a diagram of still another embodiment of the block clock generator circuit of this invention.
Figure 9:
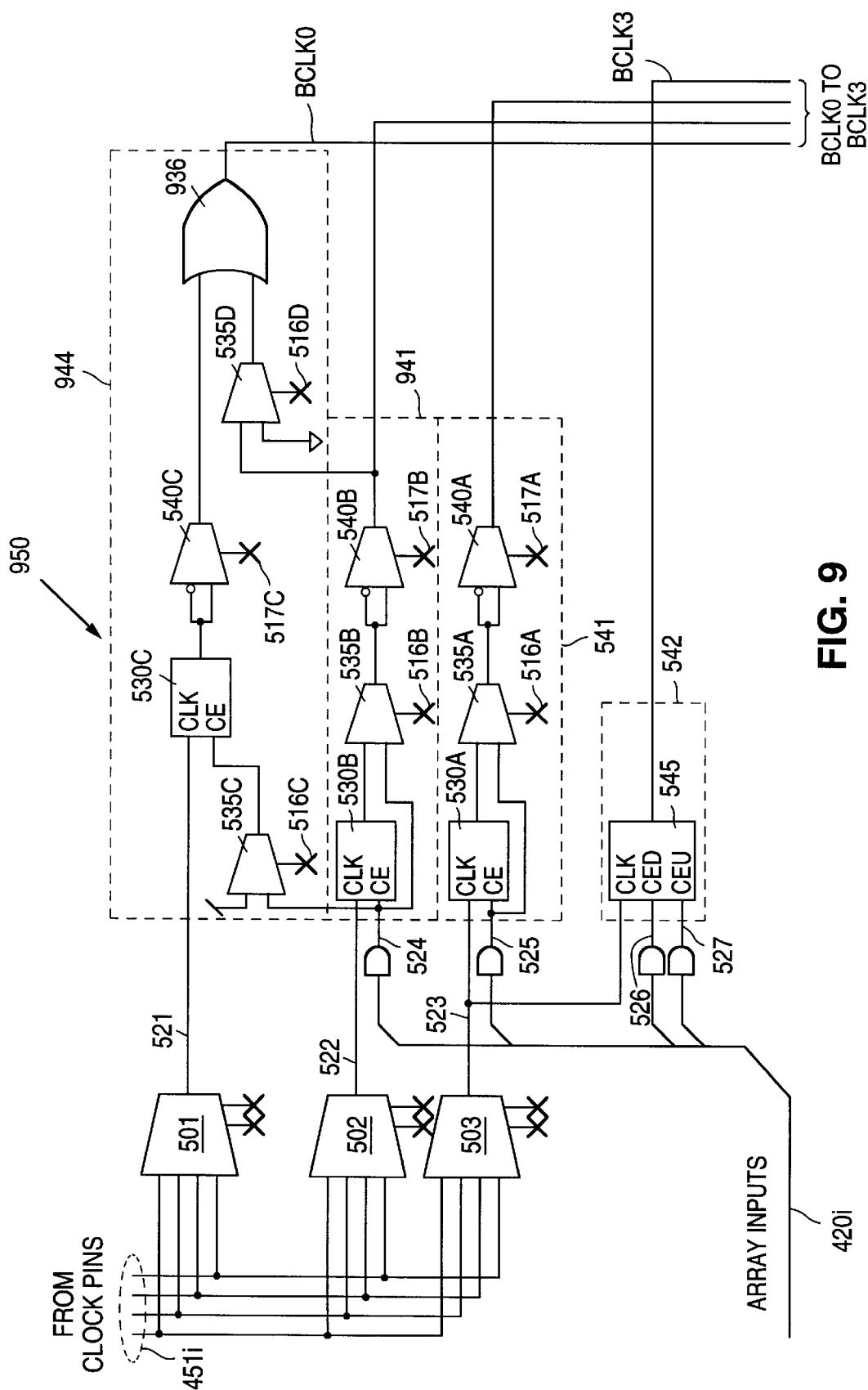
FIG. 9 is a diagram of an alternative embodiment of the block clock generator circuit of this invention.
Figure 10:
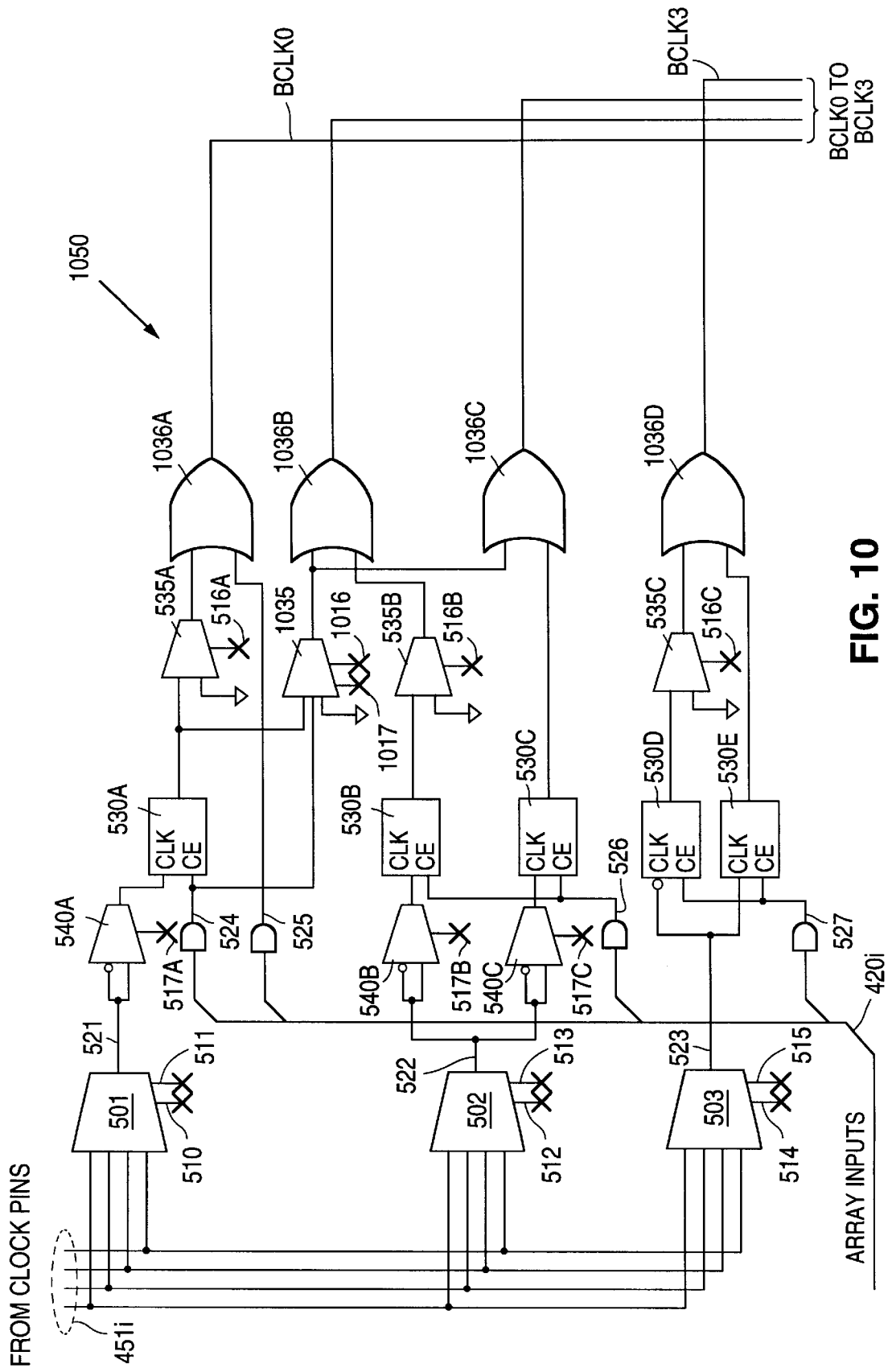
FIG. 10 is a diagram of yet another alternative embodiment of the block clock generator circuit of this invention.

FIG. 5C illustrates one embodiment of programmable block clock generator circuit 550 and programmable block initialization circuit 560. Programmable global clock selector circuit 505 receives the plurality of clock signals from clock pins 405 on global clock lines 451i. Specifically, each of four lines CLK0 to CLK3 of global clock lines 451i is connected to a different input terminal of each of programmable multiplexers 501 to 503. In this embodiment, only three programmable multiplexers are used for cost optimization.

Each programmable multiplexer has two programmable architectural cells, i.e., cells 510 and 511 for multiplexer 501, cells 512 and 513 for multiplexer 502, and cells 514 and 515 for multiplexer 503. As used herein an architectural cell may be a fuse, an EPROM cell, an EEPROM cell, a RAM cell, or a CMOS antifuse. The architectural cell is a means for configuring a programmable device.

Table 3 is one embodiment of the programming of multiplexers 501 to 503. Table 3 is illustrative only and is not intended to limit the invention to the particular embodiment shown.

TABLE 3

| Arch. Cell<br>510, 512, 514 | Arch. Cell<br>511, 513, 515 | Clock Line<br>Selected |
|---|---|---|
| 0 | 0 | CLK1 |
| 0 | 1 | CLK2 |
| 1 | 0 | CLK3 |
| 1 | 1 | CLK4 |

Upon programming of a programmable multiplexer, the multiplexer connects one input terminal to the output terminal and disconnects all other input terminals from the output terminal. Thus, the signal on the global clock line selected is passed through the multiplexer to the clock input line connected to the output terminal.

Programmable block clock generator circuit 550 receives a plurality of clock input signals on clock input lines 521 to 523, and a set of logic signals on the plurality of logic signal lines 420i. In this embodiment, the plurality of logic signal lines 420i are dedicated product terms from a programmable logic array. However, in another embodiment (not shown), the plurality of logic signal lines 420i could be shared. Programmable block clock generator circuit 550 is configured by programming a plurality of architectural cells 516 to 518 to select one or more of the functions specified in Table 1.

Clock input line 521 from multiplexer 501 is connected to a clock terminal CLK, e.g., a first input terminal, of a first clock generator circuit 530A. Herein, the specific implementation of clock generator circuit 530A is not an essential feature of the invention. Clock generator circuit 530A could be, for example a pulse generator that provides the functionality described, or alternatively only a circuit with storage elements and logic gates that provides the functionality described. A clock enable terminal CE, e.g, a second input terminal, of clock generator circuit 530A is connected to a first product term in the plurality of logic signal lines 420i.

A clock pulse is generated on output line 531 of clock generator circuit 530A to a first input terminal of programmable multiplexer 535, when product term 524 has an active state, i.e., a first state, and the signal on clock input line 521 goes active. Effectively, the clock signal on input terminal CLK is passed through clock generator circuit 530A. Conversely, if product term 524 is inactive, i.e., a second state, the signal on output line 531 remains inactive irrespective of the signal on terminal CLK. Thus, product term 524 provides a clock enable signal for the clock signal passed through multiplexer 501. Notice that product term 524 is dedicated to programmable block clock generator circuit 550 and is not alternatively available for logic applications, in this embodiment.

A second input terminal of programmable multiplexer 535 is connected to product term 524. The signal passed through programmable multiplexer 535 is determined by the state of architectural cell 516. Since programmable multiplexer 535 determines which of a plurality of signals is passed through the circuit, programmable multiplexer 535 is one embodiment of a programmable signal selector.

The output signal from programmable multiplexer 535 drives an inverting input terminal of another programmable multiplexer 540A and a normal input terminal of programmable multiplexer 540A. The signal passed through programmable multiplexer 540A to a first block clock line BCLK0 is determined by the state of architectural cell 517. Programmable multiplexer 540A functions as a polarity control element for the clock signal passed through programmable multiplexer 540A.

Hence, the clock signal on line BCLK0 can be either, a clock signal with programmable polarity control, a clock signal with programmable clock enable control and programmable polarity control, or a product-term clock signal with programmable polarity control. The clock signal on line BCLK0 is independent of the clock signals on any other of block clock lines BCLK1 to BCLK3 and so is orthogonal to the clock signals on lines BCLK1 to BCLK3.

Further, when programmable multiplexer 535 is configured to pass the product term therethrough, selection of the polarity of the product-term clock signal is effectively selection of either a sum-term clock, or a product-term clock. When programmable multiplexer 540A is configured to invert product term 524, the inverted product term is equivalent to a sum-term according to DeMorgan's theorem.

This configuration of the product term provides multiple capabilities without compromising the logic capability of the CPLD. Specifically, clock signals are generated by product term 524 when asynchronous behavior is desired. A clock event is generated when the product term 524 changes from false to true. Since product term 524 provides the logic AND function, product term 524 is true only if all of the input signals to product term 524 are true. This means that a clocking event occurs when a combination of all the input signals becomes true.

This is very straightforward if there is only one input signal to product term 524. If there are several input signals to product term 524, product term 524 defines a complex condition that causes a clock event. Such a complex clocking condition is appropriate in many cases, but not in all cases. There are situations when it is desired to have any of several input signals to product term 524 by itself can cause a clock edge. This amounts to the mixing of several simple clock signals onto a single clock signal. In the prior art, the only way to handle this in a standard configuration was to generate the asynchronous clock signal using one macrocell, and feed the output signal of that macrocell back to other macrocells that required the asynchronous clock signal. Thus, not only was the performance of the clock function compromised but also an extra macrocell was required that in turn reduced the logic utilization of the PLD.

In contrast, as indicated above, through use of the polarity control element, e.g., programmable multiplexer 540A, programmable block clock generator circuit 550 can be configured so that the block clock signal on line BCLK0 handles any one of the three possible situations for the clocking event associated with product term 524. If there is only one input signal to product term 524, product term 524 is simply passed through multiplexers 535 and 540A to line BCLK0. Similarly, if there are several input signals to product term 524, the product-term function defines a complex condition that causes a clock event and that condition is satisfied on line BCLK0 by passing product term 524 through multiplexers 535 and 540A.

However, if any of one of several input signals to product term 524 by itself can cause a clock edge, product term 524 is passed through multiplexer 535 and the inverse of product term 524 is passed through multiplexer 540A to block clock line BCLK0, which as indicated above is the fully equivalent to a sum-term according to DeMorgan's theorem. This allows a sum-term to have the same performance as a product term and does not require a macrocell. Thus, generation of the sum-term clock signal does not affect logic utilization of the CPLD.

In dual enable biphase clock generation circuit 542, clock input line 522 from multiplexer 502 is connected to a clock terminal CLK of a biphase clock generator 545. Herein, the specific implementation of biphase clock generator 545 is not an essential feature of the invention. Biphase clock generator 545 could be, for example a combination of a pulse generator and logic to provide the functionality described, or alternatively only a circuit with storage elements and logic gates that provide the functionality described. A falling edge clock enable terminal CED of biphase clock generator 545 is connected to a second product term 525 in the plurality of logic signal lines 420i. A rising edge clock enable terminal CEU of biphase clock generator 545 is connected to a third product term 526 in the plurality of logic signal lines 420i.

A clock pulse is generated on output line BCLK1 of biphase clock generator 545 when product term 525 has an active state, i.e., a first state, and the signal on clock input line 522 goes inactive, e.g., a falling edge on clock input line 522. See clock cycles 1 and 4 in FIG. 5D. Conversely, if product term 525 is inactive, i.e., a second state, a pulse is not generated on output line BCLK1 in response to a falling edge signal on terminal CLK. See clock cycles 0, 2, and 3 in FIG. 5D.

A clock pulse also is generated on output line BCLK1 of biphase clock generator 545 when product term 526 has an active state, i.e., a first state, and the signal on clock input line 522 goes active, i.e., a rising edge on clock input line 522. See clock cycles 1, 2 and 3 in FIG. 5D. Conversely, if product term 526 is inactive, i.e., a second state, a pulse is not generated on output line BCLK1 in response to a rising edge signal on terminal CLK. See clock cycles 0 and 4 in FIG. 5D.

When both product terms 525 and 526 are utilized, the combination of the input clock signal, product terms 525 and 526, and biphase clock generator 545 function as a biphase clock generator. A clock pulse is generated on block clock line BCLK1 for each edge transition of the input clock signal on clock input line 522 as shown for clock cycle 1 in FIG. 5D. The frequency of the clock signal on block clock line BCLK1 is twice the frequency of the input clock signal on clock line 522.

This embodiment of dual enable biphase clock generation circuit 542 provides significant advantages for the CPLD. For example, one application commonly implemented in prior art CPLDs was a state machine where a first output signal is feedback to the state machine as an input signal and a second output signal generated. Since the state machine typically includes a register, the second output signal operated no faster than one-half the clock frequency to the prior art CPLD. If the second output signal of the state machine was to switch at 40 MHz, which is a frequency that will only generate moderate noise with reasonable design care, an 80-MHz system clock was required.

This system clock signal was likely routed to many locations on the board that included the prior art CPLD, and consequently, the clock lines become a more effective antenna. This system clock signal also had to have very clean, sharp transitions, increasing further the harmonic content radiated. Thus, the fact that the system clock operated at twice the state machine speed significantly increased the potential for radiated noise. Further, it may not be possible to double the system clock frequency because to do so would require a frequency that resulted in violations of timing parameters such as the setup time ($t_{SU}$) for other components or circuits on the board.

A problem may also be encountered in timing resolution. Timing resolution in a system is the minimum time increment that can be generated when coordinating various system events. Since state machines are most often used to control timing, the minimum time increment that can be generated is the time between state machine transitions. So, for example, if a state machine output signal is operating at 25 MHz, there is a 20 nanosecond (ns) elapse between each transition. This 20 ns becomes the minimum timing increment that can be used. However, because traditional registers respond to only one clock edge, a single register must wait 40 ns between clock events. To get 20 ns resolution, part of the system must respond to the rising edge and part to the falling edge so that there is activity on both system clock edges. This can be difficult to design in a robust manner.

In contrast, a CPLD 400 that includes block clock generator 550, and consequently any system that includes CPLD 400, minimizes the noise and timing violations issues while enhancing the time resolution. Specifically, with dual enable biphase clock generation circuit 542 of this invention:

the same internal performance can be achieved with a clock running at half the traditional rate, resulting in much less noise;

state machines can perform at twice the master board or system frequency as long as a maximum board frequency $f_{MAX}$ is not exceeded, and without the noise that would be caused by an actual system clock running at double speed; and timing resolution is doubled (that is, the minimum time cut in half) as compared to a prior art CPLD with the same system clock frequency.

The generation of a high speed clock without increasing the system clock frequency also has other advantages. For example, the clock skew is reduced relative to a system with a high speed system clock. Also, there is lower power consumption associated with the clock distribution.

Not only are the above advantages provided by dual enable biphase clock generation circuit 542, but also, the dual clock enable signals provide a wide variety of implementations with the same circuit in addition to the biphase clock generation. For example, if product term 525 is configured in an active state, and product term 526 in an inactive state, biphase clock generator 545 functions as a clock generator that generates pulses for each falling edge on clock input line 522. Conversely, if product term 525 is configured in an inactive state, and product term 526 in an active state, biphase clock generator 545 functions as a clock generator that generates pulses for each rising edge on clock input line 522. In this configuration, a clock signal with selectable polarity is provided on line BCLK1.

In addition, configuration of biphase clock generator 545 in a particular configuration is not a fixed static result. Through changing the state of product terms 525, 526, or both, the clock signal on line BCLK1 can be dynamically changed between biphase and standard clocking, and between polarities for standard clocking. This dynamic functionality is accomplished without use of architectural cells and with only a few components, which in turn minimizes real estate requirements on the chip associated with clock signal generation.

In this embodiment, as explained above, programmable block clock and initialization circuit 450i also includes a dual output multi-function clock generation circuit 543 that receives an input clock signal on clock input line 523 and product term 527. Dual output multi-function clock generation circuit 543 generates a first clock signal on block clock line BCLK2, and a second clock signal on block clock line BCLK3. The clock signals on block clock lines BCLK2 and BCLK3 are orthogonal to clock signals on block clock lines BCLK0 and BCLK1, but are not necessarily orthogonal to each other. Thus, in the following description of dual output multi-function clock generation circuit 543, stating that a clock signal is orthogonal means that the clock signal is orthogonal to at least the signals on block clock lines BCLK0 and BCLK1.

In this embodiment of dual output multi-function clock generation circuit 543, clock input line 523 from programmable multiplexer 503 is connected to a clock terminal CLK of a second clock generator circuit 530B, that in this embodiment is the same circuit as circuit 530A. A clock enable terminal CE of clock generator circuit 530B is connected to a fourth product term 527 in the plurality of logic signal lines 420i. A clock pulse is generated on output line BCLK2 of clock generator circuit 530B when product term 527 has an active state, i.e., a first state, and the signal on clock input line 523 goes active. Effectively, the clock signal on input terminal CLK is passed through clock generator circuit 530B. Conversely, if product term 527 is inactive, i.e., a second state, the signal on output line BCLK2 remains inactive irrespective of the signal on terminal CLK. Thus, product term 527 provides a clock enable signal for the clock signal on block clock line BCLK2. Notice that, in this embodiment, product term 527 is dedicated to programmable block clock generator circuit 550 and is not alternatively available for logic applications.

The signal on block clock line BCLK2 drives an inverting input terminal of programmable multiplexer 540B. A normal input terminal of programmable multiplexer 540B is connected to product term 527. The signal passed through programmable multiplexer 540B to a fourth block clock line BCLK3 is determined by the state of architectural cell 518. Programmable multiplexer 540B functions as a programmable clock selection element for block clock line BCLK3.

Hence, the clock signal on line BCLK3 can be either a clock signal with programmable clock enable control that has a polarity opposite to the polarity of the signal on block clock line BCLK2, or a product-term clock signal. The clock signal on line BCLK2 is independent of the clock signals on any other of block clock lines BCLK0 and BCLK1 and so is orthogonal to the clock signals on lines BCLK0 to BCLK1. If the product term is passed to block clock line BCLK3, all of the signals on block clock lines BCLK0 to BCLK3 are orthogonal.

Thus, in this embodiment, four dedicated product terms are available for clock enable functions. Unlike prior art implementations of clock enable functions, this invention:
does not reduce the amount of logic available for basic logic functions as did prior art applications that provided a product term for either clock enable or a logic application;
eliminates the extra space for an architectural cell in each macrocell that determined whether the product term was used for clock enable or for a logic application;
eliminates the need to route a product term to each macrocell for the clock enable function; and
eliminates the need for providing multiple clock enable product terms that are not utilized and so results in wastage of resources.

In addition to the clock enable functions, in this embodiment, as described above, two separate product term clock functions are provided for each programmable logic block, which, given the number of programmable logic blocks in a typical CPLD, addresses the great majority of asynchronous clocking needs.

This is done with only two product terms that are not shared with logic product terms. However as shown in FIG. 5C, the product term resources available for clocking are the same resources that are used for clock enable product terms. Since clock enable implements more efficiently a function sometimes handled via product-term clocks, it makes sense to have these functions share the same product-term resources.

Another benefit of this configuration is that fewer architectural configuration cells are needed for product term clock selection: two per block instead of one per macrocell which is typically sixteen per block. A macrocell tends to be very tightly packed with circuitry, and having the clock enable and product-term clock functions provided at the block level reduces the size of the macrocell, yielding a more cost-effective solution.

In addition to the efficiency of circuit implementation, this structure also makes multiple-use clocks easy and efficient. The clock function generated within the block is available to all macrocells within that block. There is no need for signals to go off-chip to implement a complex multiple-clock function. To the knowledge of the inventors, this capability is available on no other CPLD.

The combination of architectural cells and product terms in block clock generator 550 is used to perform at least one of the following functions:
1. invert multiple-use dedicated clocks;
2. provide a single-use simple clock (of any polarity);
3. add lower-performance multiple-use simple clock signals when not enough dedicated external clock signals are available;
4. provide a single-use synchronized complex clock;
5. provide a multiple-use synchronized complex clock;
6. provide a single-use unsynchronized complex clock; and
7. provide a multiple-use unsynchronized complex clock All of these functions are easily implemented with block clock generator 550. Functions 2, 4, and 6 cannot be done on a per macrocell basis, but this level of functionality is rarely if ever required. Functions 4 and 5 are not only very easy to implement, but also are fast when implemented with a clock enable. Here, fast means the time required is less that required to implement the same functionality using only a product-term clock.

In addition to programmable clock generator circuit 550, programmable block clock and initialization circuit 450i in this embodiment also includes a programmable block initialization circuit 560. In the embodiment illustrated in FIG. 5C, product term 561 directly drives block initialization line BINIT0. Product term 562 drives an inverting input terminal of another programmable multiplexer 540C and a normal input terminal of programmable multiplexer 540C. The signal passed through programmable multiplexer 540C to a second block initialization BINIT1 is determined by the state of architectural cell 519. Programmable multiplexer 540C functions as a polarity control element for product term 562.

Similarly, product term 563 drives an inverting input terminal of yet another programmable multiplexer 540D and a normal input terminal of programmable multiplexer 540D. The signal passed through programmable multiplexer 540D to a second block initialization BINIT2 is determined by the state of architectural cell 520. Programmable multiplexer 540D functions as a polarity control element for product term 563.

Since the initialization signals on lines BINIT0 to BINIT2 are generated by product terms 561 to 563, respectively, an initialization signal is generated on a particular line only if the product term driving that line is true. Since the product term provides the logic "AND" function, the product term is true only if all of its input signals to the product term are true. This means that initialization occurs only when each signal in a predefined combination of signals is true. This is very straightforward if there is only one input signal to the product term. However, if there are several input signals, the product term defines a complex condition that causes initialization.

An initialization that requires each signal in a predefined combination of signals to be true is appropriate in many cases, but not in all cases. There are situations where any of one several input signals by itself is desired to cause an initialization. There may be, for example, a number of "interrupt" signals or fault indicators, any of which by itself would trigger initialization.

Previously, in CPLDs, the only way to handle this type of initialization was to generate a product term, or a sum-term using a first macrocell, and feed the result back to the macrocells that were initialized (inverting if a product term was generated). In each case, the performance of the initialization function was compromised by the time delay associated with generating the initialization signal and logic utilization was compromised by requiring an extra macrocell to generate the initialization signal.

In contrast, in programmable block initialization circuit 560, architectural cells 519 and 520 provide the user either sum-term or product-term initialization signals. This amounts to a selection of the polarity on the initialization product term. When inverted, the product term looks like a sum-term, according to DeMorgan's Theorem. This allows a sum-term to behave with the same performance as a product term, with no wasted macrocells.

In FIGS. 6 to 10, components and circuit that are the same as those in FIGS. 5A and 5C have the same base reference numeral. Alphanumeric characters have been added to the reference numerals simply to avoid confusion as to which component is being described.

Block clock generator circuit 650 has four clock input lines 521 to 523, and 624. Clock input lines 521 to 523 are driven by four-to-one programmable multiplexers 501 to 503, respectively, as described above. Input line 624 is driven by a fourth four-to-one programmable multiplexer 604. The four input terminals of programmable multiplexer 604 are connected to global lines CLK0 to CLK3, respectively, of clock lines 451i. The clock signal passed through programmable multiplexer 604 is determined by architectural cells 616 and 617, that function in a manner equivalent to that presented in TABLE 1.

In this embodiment, programmable block clock generator circuit 650 (FIG. 6) has six input product terms 524 to 527 and 628 and 629. Clock input line 521 and product terms 524 and 525 drive a first dual enable biphase clock generation circuit 542A, that in turn drives first block clock line BCLK0. Clock input line 522 and product terms 526 and 527 drive a second dual enable biphase clock generation circuit 542B. Dual enable biphase clock generation circuit 542A drives second block clock line BCLK1. Clock input line 523 and product term 628 drive a first multi-function clock and product-term clock generation circuit 541A that in turn drives third block clock line BCLK2. Clock input line 624 and product term 629 drive a second multi-function clock and product-term clock generation circuit 541B that in turn drives third block clock line BCLK3.

The operation and functionality of multi-function clock and product-term clock generation circuits 541A and 541B are identical to the operation and functionality of multi-function clock and product-term clock generation circuit 541, and the description of circuit 541 is incorporated herein by reference. The operation and functionality of dual enable biphase clock generation circuits 542A and 542B are identical to the operation and functionality of dual enable biphase clock generation circuit 542, and the description of circuit 542 is incorporated herein by reference.

Block clock generator circuit 750 (FIG. 7) has the same input lines as circuit 550, i.e, three clock input lines 521 to 523 and four product terms 524 to 527, and the description of those inputs are incorporated herein by reference. Further, the configuration of (i) clock input line 521, product term 524, multi-function clock and product-term clock generation circuit 541, and block clock line BCLK0, and (ii) clock input line 522, product terms 525, and 526, dual enable biphase clock generation circuit 542, and block clock line BCLK1 is identical to that described above with respect to FIG. 5C and that description is incorporated herein by reference.

However, in this embodiment, dual output multi-function clock generation circuit 543 in FIG. 5C is replaced with a second embodiment of dual output multi-function clock generation circuit 743. Dual output multi-function clock generation circuit 743 receives an input clock signal on clock input line 523 and product term 525 as input signals. Dual output multi-function clock generation circuit 743 generates a first clock signal on block clock line BCLK2, and a second clock signal on block clock line BCLK3 that is the inverse of the clock signal on block clock line BCLK2. The clock signals on block clock lines BCLK2 and BCLK3 are orthogonal to clock signals on block clock lines BCLK0 and BCLK1, but are not orthogonal to each other.

In this embodiment, dual output multi-function clock generation circuit 743 generates on block clock line BCLK2 any one of:

i) a block-level clock signal; and
ii) a block-level clock signal with clock enable.

In this embodiment of dual output multi-function clock generation circuit 743, clock input line 523 from programmable multiplexer 503 is connected to a clock terminal CLK of second clock generator circuit 530B. A clock enable terminal CE of clock generator circuit 530B is connected to fourth product term 527 in the plurality of logic signal lines 420i. A clock pulse is generated on output line BCLK2 of clock generator circuit 530B, as described above.

Product term 527 provides a clock enable signal for the clock signal on block clock line BCLK2. The signal on block clock line BCLK2 drives inverter 740 that in turn drives block clock line BCLK3. Hence, the clock signal on line BCLK3 always has a polarity opposite to the signal on block clock line BCLK2.

Block clock generator circuit 850 (FIG. 8) has the same input lines as circuit 550, i.e, three clock input lines 521 to 523 and four product terms 524 to 527 and the description of those inputs is incorporated herein by reference. Further, the configuration of (i) clock input line 521, product term 524, multi-function clock and product term clock generation circuit 541, and block clock line BCLK0, and (ii) clock input line 522, product terms 525, and 526, dual enable biphase clock generation circuit 542, and block clock line BCLK1 is identical to that described above with respect to FIG. 5A and that description is incorporated herein by reference.

However, in this embodiment, dual output multi-function clock generation circuit 543 in FIG. 5C is replaced with a third embodiment of dual output multi-function clock generation circuit 843. Dual output multi-function clock generation circuit 843 receives an input clock signal on clock input line 523 and product term 527. Dual output multi-function clock generation circuit 843 generates a first clock signal on block clock line BCLK2, and a second clock signal on block clock line BCLK3. The clock signals on block clock lines BCLK2 and BCLK3 are orthogonal to clock signals on block clock lines BCLK0 and BCLK1, but are not orthogonal to each other.

In this embodiment, dual output multi-function clock generation circuit 843 generates on block clock lines BCLK2 and BCLK3 any one of:

i) a block-level clock signal;
ii) a block-level clock signal with clock enable;
iii) an inverse of the block-level clock signal; and
iv) an inverse of the block-level clock signal with clock enable.

In this embodiment of dual output multi-function clock generation circuit 843, clock input line 523 from programmable multiplexer 503 is connected to a clock terminal CLK of second clock generator circuit 530B. A clock enable terminal CE of clock generator circuit 530B is connected to fourth product term 527 in the plurality of logic signal lines 420i. Product term 527 functions as a clock enable.

The output signal on line 531B from clock generator circuit 530B drives an inverting input terminal of another programmable multiplexer 540B and a normal input terminal of programmable multiplexer 540B. The output signal on line 531B from clock generator circuit 530B drives an inverting input terminal of yet another programmable multiplexer 540C and a normal input terminal of programmable multiplexer 540C. The signal passed through programmable multiplexer 540B to third block clock line BCLK2 is determined by the state of architectural cell 517B. The signal passed through programmable multiplexer 540C to fourth block clock line BCLK3 is determined by the state of architectural cell 517C. Programmable multiplexers 540B and 540C function as polarity control elements for clock signals on block clock lines BCLK2 and BCLK3, respectively. Notice that the implementation of dual output multi-function clock generation circuit 743 provides the same basic functionality as dual output multi-function clock generation circuit 843 with fewer components and architectural cells.

Block clock generator circuit 950 (FIG. 9) has the same input lines as circuit 550, i.e, three clock input lines 521 to 523 and four product terms 524 to 527, and the description of those inputs is incorporated herein by reference. However, in this embodiment, none of the block clock signals are orthogonal.

Clock input line 523 and product terms 526 and 527 drive dual enable biphase clock generation circuit 542 that in turn drives fourth block clock line BCLK3. Clock input line 523 and product terms 525 drive multi-function clock and product-term clock generation circuit 541 that in turn drives third block clock line BCLK2. Thus, in this embodiment, clock input line 523 is connected to two circuits.

The operation and functionality of multi-function clock and product-term clock generation circuit 541 is identical to that described above. The operation and functionality of dual enable biphase clock generation circuits 542 also is identical to that described above.

Clock input line 522 and product-term 524 are input to a second embodiment of multi-function clock and product-term clock generation circuit 941. Multi-function clock and product-term clock generation circuit 941 drives second block clock line BCLK1. The internal components and connections of those components of multi-function clock and product-term clock generation circuit 941 are the same as those in multi-function clock and product-term clock generation circuit 541. However, in this embodiment, input product-term 524 is shared with complex clock generation circuit 944 as is the output signal on block clock line BCLK1. Thus, the operation and functionality of multi-function clock and product-term clock generation circuit 941 is the same as the functionality of multi-function clock and product-term clock generation circuit 541, except for the lack of orthogonality introduced by the sharing of the input product-term and the output clock signal.

Complex clock generation circuit 944 has a clock generator circuit 530C with an input terminal CLK connected to clock input line 521. Clock enable terminal CE of clock generator circuit 530C is connected to an output terminal of a two-to-one programmable multiplexer 535C.

A first input terminal of programmable multiplexer 535C is connected to a power supply voltage that supplies a signal with a logic one level. A second input terminal of programmable multiplexer 535C is connected to product term 524. The signal passed through programmable multiplexer 535C is determined by architectural cell 516C. If the logic one signal is passed through programmable multiplexer 535C, the clock enable of clock generation circuit 530C is statically enabled. Conversely if product term 524 is passed through, the clock enable of clock generation circuit 530C is dynamically enabled and disabled based upon the state of product term 524.

The output signal from clock generation circuit 530C drives an inverting input terminal and a normal input terminal of two-to-one programmable multiplexer 540C. As described above, multiplexer 540C is a polarity control element, and the polarity of the clock signal passed through multiplexer 540C is determined by architectural cell 517C.

The output line from multiplexer 540C is connected to a first input terminal of an OR gate 936, which is one embodiment of a logic gate. The output terminal of OR gate 936 drives first block clock line BCLK1. A second input terminal of OR gate 536 is connected to an output terminal of a two-to-one programmable multiplexer 535D.

A first input terminal of programmable multiplexer 535D is connected to block clock line BCLK1. A second input terminal of programmable multiplexer 535D is connected to a power supply voltage that supplies a signal with a logic zero level, e.g. a ground. The signal passed through programmable multiplexer 535D is determined by architectural cell 516D. If the logic zero is passed through programmable multiplexer 535D, the clock signal of clock generation circuit 530C drives block clock line BCLK0. In this case, circuit 944 generates either a clock signal, or a clock enabled clock signal of a predefined polarity. Conversely, if the clock signal on block clock line BCLK1 is passed through multiplexer 535D, the signal on block clock line BCLK0 is the logic sum of the signal from clock generation circuit 530C with a predefined polarity, and the signal on BCLK1.

Block clock generator circuit 1050 is an even more complex circuit where each of the block clock signals is a logic function of two clock signals. Clock input line 521 is connected to an inverting terminal and a normal input terminal of a programmable two-to-one multiplexer 540A that is configured using architectural cell 517A. The output signal from multiplexer 540A drives terminal CLK of clock generator 530A. Clock enable terminal CE of clock generator 530A is connected to product term 524.

The output signal from clock generator 530A drives a first input terminal of programmable multiplexer 535A. A second input terminal of programmable multiplexer 535A is connected to a power supply voltage that supplies a signal with a logic zero level, e.g. a ground. The signal passed through programmable multiplexer 535A is determined by architectural cell 516A.

The output signal from programmable multiplexer 535A drives a first input terminal of OR gate 1036A. A second input terminal of OR gate 1036A is connected to product term 525. The output signal from OR gate 1036A drives block clock line BCLK0.

If the logic zero is passed through multiplexer 535A to OR gate 1036A, the output signal of OR gate 1036A is a product-term clock. Conversely, if the clock signal is passed through multiplexer 535A, the output signal of OR gate 1036A is a logic sum of a clock signal with selectable polarity and product term 525.

Clock input line 522 (FIG. 10) is connected to an inverting terminal and a normal input terminal of a programmable two-to-one multiplexer 540B that is configured using architectural cell 517B, and to an inverting terminal and a normal input terminal of a programmable two-to-one multiplexer 540C that is configured using architectural cell 517C. The output signal from multiplexer 540B drives terminal CLK of clock generator 530B. Clock enable terminal CE of clock generator 530B is connected to product term 526. The output signal from multiplexer 540C drives terminal CLK of clock generator 530C. Clock enable terminal CE of clock generator 530C also is connected to product term 526.

The output signal from clock generator 530B drives a first input terminal of programmable multiplexer 535B. A second input terminal of programmable multiplexer 535B is connected to a power supply voltage that supplies a signal with a logic zero level, e.g. a ground. The signal passed through programmable multiplexer 535B is determined by architectural cell 516B.

The output signal from programmable multiplexer 535B drives a second input terminal of OR gate 1036B. A second input terminal of OR gate 1036B is connected to a programmable three-to-one multiplexer 1035 that is configured by architectural cells 1016 and 1017. A first input terminal of multiplexer 1035 is connected to the output terminal of clock generator 530A. A second input terminal of multiplexer 1035 is connected to product term 521. A third input terminal of multiplexer 1035 is connected to the logic zero voltage level.

The output signal from OR gate 1036B drives block clock line BCLK1. Table 4 gives the possible clock signals on block clock line BCLK1 for various configurations of multiplexers 1035 and 535B.

TABLE 4

| Signal One In to OR Gate 1036B | Signal Two In to OR Gate 1036B | BCLK1 |
|---|---|---|
| ±LCLK1 (CE) | ±LCLK2 (CE) | ±LCLK1 (CE) + ±LCLK2 (CE) |
| ±LCLK1 (CE) | 0 | ±LCLK1 (CE) |
| PT0 | ±LCLK2 (CE) | PT0 + ±LCLK2 (CE) |
| PT0 | 0 | PT0 |
| 0 | ±LCLK2 (CE) | ±LCLK1 (CE) |
| 0 | 0 | 0 | where

±=programmable polarity;

LCLK1=clock signal of clock generator 530A;

LCLK2=clock signal of clock generator 530B;

(CE)=clock enable available

PT0=product term 524; and

0=logic zero.

The output signal from clock generator 530C drives a second input terminal of OR gate 1036C. A first input terminal of OR gate 1036C is driven by the output signal from programmable multiplexer 1035. The output terminal of OR gate 1036C drives block clock line BCLK2. Table 5 gives the possible clock signals on block clock line BCLK2 for various configurations of multiplexer 1035.

TABLE 5

| Signal One In to OR Gate 1036C | Signal Two In to OR Gate 1036C | BCLK2 |
|---|---|---|
| ±LCLK1 (CE) | ±LCLK3 (CE) | ±LCLK1 (CE) + ±LCLK3 (CE) |
| PT0 | ±LCLK3 (CE) | PT0 + ±LCLK3 (CE) |
| 0 | ±LCLK3 (CE) | ±LCLK3 (CE) | where

±=programmable polarity;

LCLK1=clock signal of clock generator 530A;

LCLK3=clock signal of clock generator 530C;

(CE)=clock enable available

PT0=product term 524; and

0=logic zero.

Clock input line 523 (FIG. 10) is connected to an inverter on terminal CLK of clock generator 530D and to terminal CLK of clock generator 530E. Terminals CE of clock generators 530D and 530E are connected to product term 527.

The output signal from clock generator 530D drives a first input terminal of programmable multiplexer 535C that is configured by architectural cell 516C. A second input terminal of programmable multiplexer 535C is connected to the logic zero voltage level.

The output signal from programmable multiplexer 535C drives a first input terminal of OR gate 1036D. A second input terminal of OR gate 1036D is driven by the output signal of clock generator 530E. OR gate 1036D drives block clock line BCLK3. Table 6 gives the possible clock signals on block clock line BCLK3 for various configurations of multiplexer 535C.

TABLE 6

| Signal One In to OR Gate 1036C | Signal Two In to OR Gate 1036C | BCLK3 |
|---|---|---|
| −LCLK5 (CE) | LCLK5 (CE) | −LCLK5 (CE) + LCLK5 (CE) |
| 0 | LCLK5 (CE) | LCLK5 (CE) | where

−=inverse

LCLK5=clock signal of clock generator 530E;

(CE)=clock enable available

Notice that the signal on line BCLK2 is either a biphase clock signal or a standard clock signal, both with a single clock enable.

Figure 11A:
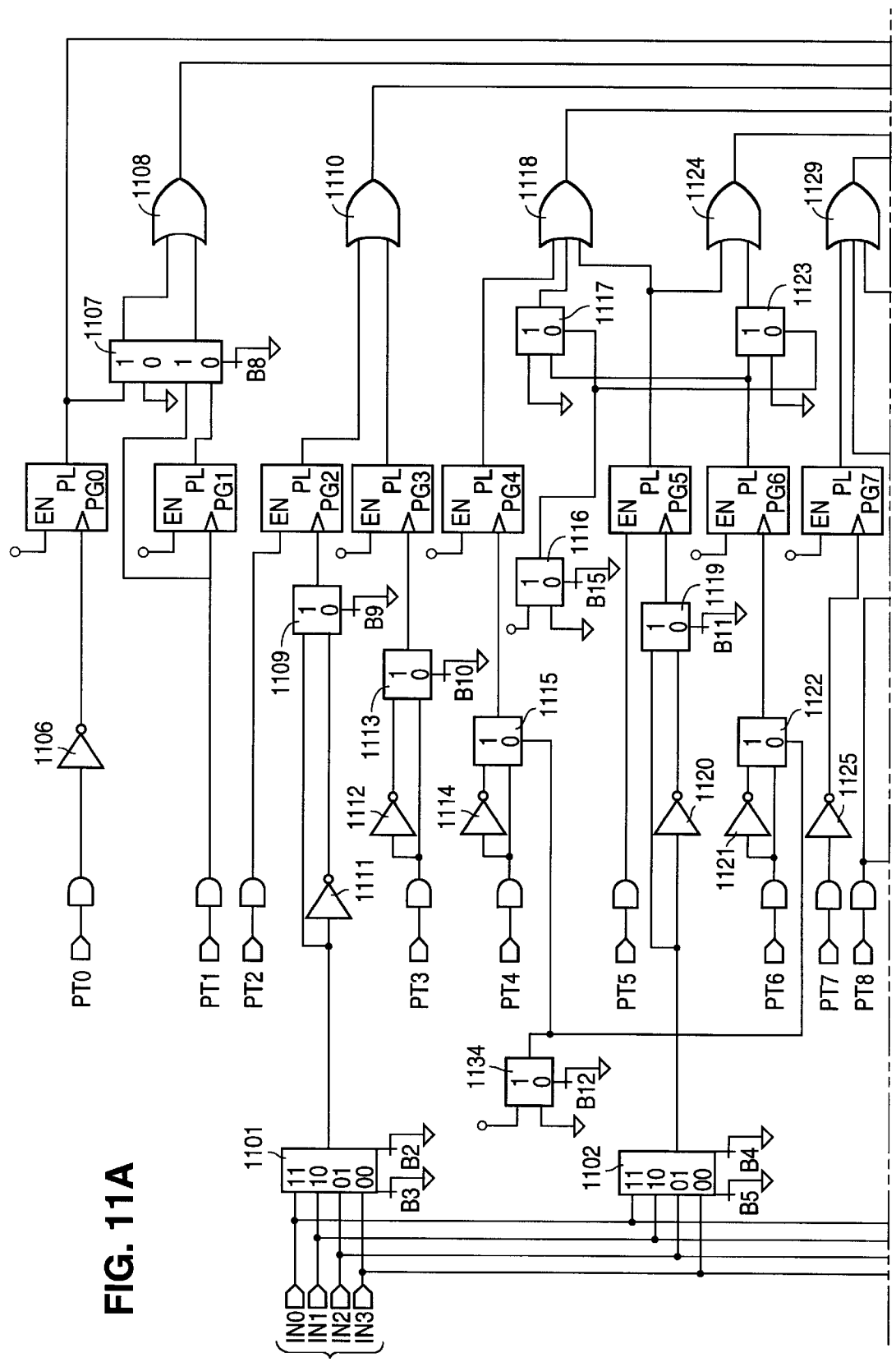
FIG. 11 is a key to FIGS. 11A and 11B, which are diagrams of still another alternative embodiment of the block clock generator circuit of this invention.

FIG. 11, that is a key to FIGS. 11A and 11B, is a more detailed diagram of yet another embodiment of a block clock generator 1150. The four global clock signals from dedicated clock pins 405 are input signals to programmable multiplexers 1101 to 1103. Each of programmable multiplexers has two architectural cells, i.e, cells B2 and B3 for multiplexer 1101, cells B4 and B5 for multiplexer 1102, and cells B6 and B7 for multiplexer 1103, that are programmed to pass one of the four global clock signals therethrough to the output line of the programmable multiplexer. In FIG. 11, the numbers within a programmable multiplexer adjacent to a particular input line represent the state of the architectural cell or cells for which the signal on the particular multiplexer input line is passed through the multiplexer to the output line.

Block clock generator 1150 also includes a plurality of pulse generators PG0 to PG10. Each pulse generator PGi has an enable terminal, a clock terminal, and a pulse output terminal. When the signal on the enable terminal is active and a signal on the clock terminal goes active, pulse generator PGi generates a pulse having a predetermined width on the pulse output terminal. Specifically, the pulse generator provides a narrow pulse that occurs at the leading edge of the pulse on the clock terminal. While in this embodiment pulse generators are utilized, those other techniques used to generate a pulse are described in copending, commonly filed, and commonly assigned U.S. patent application Ser. No. 08/458,865, entitled "MACROCELL AND CLOCK SIGNAL ALLOCATION CIRCUIT FOR A PROGRAMMABLE LOGIC DEVICE (PLD) ENABLING PLD RESOURCES TO PROVIDE MULTIPLE FUNCTIONS," of Bradley A. Sharpe-Geisler, filed on Jun. 2, 1995, now U.S. Pat. No. 5,589,782, which is incorporated herein by reference in its entirety. As explained more completely in the application of Sharpe-Geisler, the pulse generators described below can have variable sized pulses widths to accommodate differing control and clock signal requirements. For example, an asynchronous reset signal may require a wider pulse width than a clock signal generated using a direct clock input signal.

Control product terminal PT0 drives an inverter 1106 which in turn drives a clock terminal of pulse generator PG0. The enable terminal of pulse generator PG0, as well as the enable terminal of each of pulse generators PG1, PG3, PG4, PG6, PG7 and PG10, is tied to the power supply voltage, i.e., a first reference voltage. The signal on the output terminal of pulse generator PG0 drives block clock line BCLK0 and a first input terminal of a dual programmable two-to-one multiplexer 1107. As is apparent from the following description, herein a dual programmable two-to-one multiplexer is effectively two programmable two-to-one multiplexers with a common architectural configuration cell.

A second input terminal of a dual programmable two-to-one multiplexer 1107 is tied to ground, i.e., to a second reference voltage. The signal passed from one of the first and second input terminals to a first output line of multiplexer 1107 is determined by the state of architectural cell B8. The signal on the first output line of multiplexer 1107 drives a first input terminal of OR gate 1108.

Control product term PT1 drives a clock terminal of pulse generator PG1 and a third input terminal of dual two-to-one multiplexer 1107. The fourth input terminal of multiplexer 1107 is driven by the signal from the output terminal of pulse generator PG1. The signal passed from one of the third and fourth input terminals to a second output line of multiplexer 1107 also is determined by the state of architectural cell B8. The signal on the second output line of multiplexer 1107 drives a second input terminal of OR gate 1108. The output signal of OR gate 1108 drives block clock line BCLK1.

Control product term PT2 drives the enable terminal of pulse generator PG2. The signal on the output line of multiplexer 1101 drives an inverter 1111 and a first input terminal of a programmable two-to-one multiplexer 1109. The second input terminal of multiplexer 1109 is driven by the output signal of inverter 1111.

The signal passed through multiplexer 1109 to the clock terminal of pulse generator PG2 is determined by the state of architectural cell B9. The signal on the output terminal of pulse generator PG2 drives a first input terminal of OR gate 1110.

Control product term PT3 drives an inverter 1112 and a first input terminal of a programmable two-to-one multiplexer 1113. The second input terminal of multiplexer 1113 is driven by the output signal of inverter 1112. The signal passed through multiplexer 1113 to the clock terminal of pulse generator PG3 is determined by the state of architectural cell B10. The signal on the output terminal of pulse generator PG3 drives a second input terminal of OR gate 1110. The output signal of OR gate 1110 drives block clock line BCLK2.

Control product term PT4 drives an inverter 1114 and a first input terminal of a programmable two-to-one multiplexer 1115. The second input terminal of multiplexer 1115 is driven by the output signal of inverter 1114. The signal passed through multiplexer 1115 to the clock terminal of pulse generator PG4 is determined by the a signal on the output line of programmable two-to-one multiplexer 1134.

A first input terminal of multiplexer 1134 is connected to the power supply voltage and a second input terminal is connected to ground. The signal passed through multiplexer 1134 is determined by the state of architectural cell B12. The signal on the output terminal of pulse generator PG4 drives a first input terminal of OR gate 1118. The output signal of OR gate 1118 drives block clock line BCLK3.

A signal on the output line of programmable two-to-one multiplexer 1117 drives a second input terminal of OR gate 1118. A first input terminal of multiplexer 1117 is connected to ground, and a second input terminal is driven by the output signal from pulse generator PG6. The signal passed through multiplexer 1117 is determined by the state of the signal on the output line of programmable two-to-one multiplexer 1116. A first input terminal of multiplexer 1116 is connected to the power supply voltage and a second input terminal is connected to ground. The signal passed through multiplexer 1116 is determined by the state of architectural cell B15.

Control product term PT5 drives the enable terminal of pulse generator PG5. The signal on the output line of multiplexer 1102 drives an inverter 1120 and a first input terminal of a programmable two-to-one multiplexer 1119. The second input terminal of multiplexer 1119 is driven by the output signal of inverter 1120.

The signal passed through multiplexer 1119 to the clock terminal of pulse generator PG5 is determined by the state of architectural cell B11. The signal on the output terminal of pulse generator PG5 drives a third input terminal of OR gate 1118, and a first input terminal of OR gate 1124.

Control product term PT6 drives an inverter 1121 and a first input terminal of a programmable two-to-one multiplexer 1122. The second input terminal of multiplexer 1122 is driven by the output signal of inverter 1121. The signal passed through multiplexer 1122 to the clock terminal of pulse generator PG6 is determined by the a signal on the output line of two-to-one multiplexer 1134.

The signal on the output terminal of pulse generator PG6 drives the input terminal of multiplexer 1117 as described above, and a first input terminal of a programmable two-to-one multiplexer 1123. A second input terminal of multiplexer 1123 is connected to ground. The signal passed through multiplexer 1123 to a second input terminal of OR gate 1124 is determined by the output signal from multiplexer 1116, that was described above. The output signal from OR gate 1124 drives block clock line BCLK4.

Control product term PT7 drives inverter 1125 which in turn drives a clock terminal of pulse generator circuit PG7. The output signal from pulse generator PG7 drives a first input terminal of OR gate 1129.

Control product term PT8 drives an enable terminal of pulse generator PG8 and a first input terminal of programmable two-to-one multiplexer 1126. The output line of multiplexer 1103 drives a clock terminal of pulse generator PG9, and an inverter 1127, which in turn drives a clock terminal of pulse generator PG8. The output signal from pulse generator PG8 drives a second input terminal of a dual programmable two-to-one multiplexer 1128, and a second input terminal of OR gate 1129.

First and third input terminals of multiplexer 1128 are grounded. The signal passed through multiplexer 1128 from one of the first and second input terminals to a first output line, that is connected to a first input terminal of OR gate 1130, is determined by the state of the signal from inverter 1132.

A first input terminal of a programmable two-to one multiplexer 1105 is connected to the power supply voltage and a second input terminal is connected to ground. The signal passed through multiplexer 1105 to an output line, that is connected a second input terminal of multiplexer 1126 and to a first input terminal of AND gate 1131, is determined by the state of architectural cell B14.

The signal passed through multiplexer 1126 to an enable terminal of pulse generator PG9 is determined by the output signal from programmable two-to-one multiplexer 1104. A first input terminal of multiplexer 1104 is connected to the power supply voltage and a second input terminal is connected to ground. The signal passed through multiplexer 1104 to an output line, that is also connected a second input terminal of AND gate 1131, is determined by the state of architectural cell B13.

The output signal from AND gate 1131 drives inverter 1132, which in turn provides a signal select signal to multiplexer 1128, as described above. The output signal from pulse generator PG9 drives a fourth input terminal of multiplexer 1128 and a second input terminal of OR gate 1130.

The signal passed through multiplexer 1128 from the third and fourth input terminals to a second output line, that is connected to a third input terminal of OR gate 1129, is determined by the state of the signal from inverter 1132. The output signal of OR gate 1129 drives block clock line BCLK5.

Control product terminal PT9 drives an inverter 1133 which in turn drives the clock terminal of pulse generate PG10. The signal on the output terminal of pulse generator PG10 drives a third input terminal of OR gate 1130. The output signal of OR gate 1130 drives block clock line BCLK6.

The various block clock signals BCLKi, where i varies from zero to six, generated by this embodiment of block clock generator 1150 can be summarized as follows.
 Define:
  PIN_CLK[k]=signal passed through global clock multiplexers where k=0 corresponds to multiplexer 1101, k=1 corresponds to multiplexer 1102, and k=2 corresponds to multiplexer 1103.
  B_CLKj=jth block clock signal.
  PICKn[a, . . . , b]=a fuse selected component of vector [a, . . . , b] where index n in PICKn is a unique identifier that corresponds directly to the architectural cell number in FIG. 11 where n ranges from 8 to 14. In some cases, PICKn denotes the selected component of multiple vectors, i.e, PICKn[a, . . . , b]=a if and only if PICKn[c, . . . , d]=c.
  PLG(<enable>, <primary_sig>)=a pulse generator output signals where <enable> is the signal connected to the enable terminal of the pulse generator and <primary_sig> is the signal connected to the clock terminal of the pulse generator.
  PTj=the jth control product term within block clock generator 1150.
  PT_PLj=PLG(VCC, PTj) which is the output signal generated by a pulse generator that has the power supply voltage connected to the enable terminal and the jth product term connected to the clock terminal.
  \PT_PLj=PLG( VCC, \PTj)
With these definitions, the seven block clock signals are given by:
  BCLK0=\PT_PL0
  BCLK1=PICK8[PT1+\PT_PL0, PT_PL1]
  BCLK2=PICK10[PT_PL3, \PR_PL3]+PLG(PT2, PICK9[PIN_CLK[0], \PIN_CLK[0]]).
  BCLK3=PICK12[PT_PL4+PT_PL6, \PT_PL4]+TMP1
  BCLK4=PICK12[PTPL6, \PT_PL6]+TMP1
  BCLK5=\PT_PL7+\PICKX[TMP2, TMP3]
  BCLK6=\PT_PL9+\PICKX[TMP2, TMP5]
where
  TMP1=PLG(PT5, PICK11[PIN_CLK[1], \PIN_CLK[1]).
  TMP2=TMP3*TMP4
  TMP3=PLG(PT8, \PIN_CLK[2])
  TMP4=PLG(PT8, PIN_CLK[2])
  TMP5=PLG(PICKY[GNC, VCC, PT8], PIN_CLK[2])
PICKX AND PICKY are controlled by a combination of architectural cells B13 and B14. In PICKX[e,f], the selection of the first component e corresponds to when architectural cells B13 and B14 are both a logical one. The second component f must be selected for each of the other three configurations of architectural cells B13 and B14, i.e, in each of the other three modes of block clocks BCLK5 and BCLK6. PICKY[GNC, VCC, PT8] is the mechanism for selecting one of the other three modes. These modes correspond component wise within PICKY to setting (0,0), (0,1), and (1,0) respectively of architectural cells B13, and B14.

Figure 12:
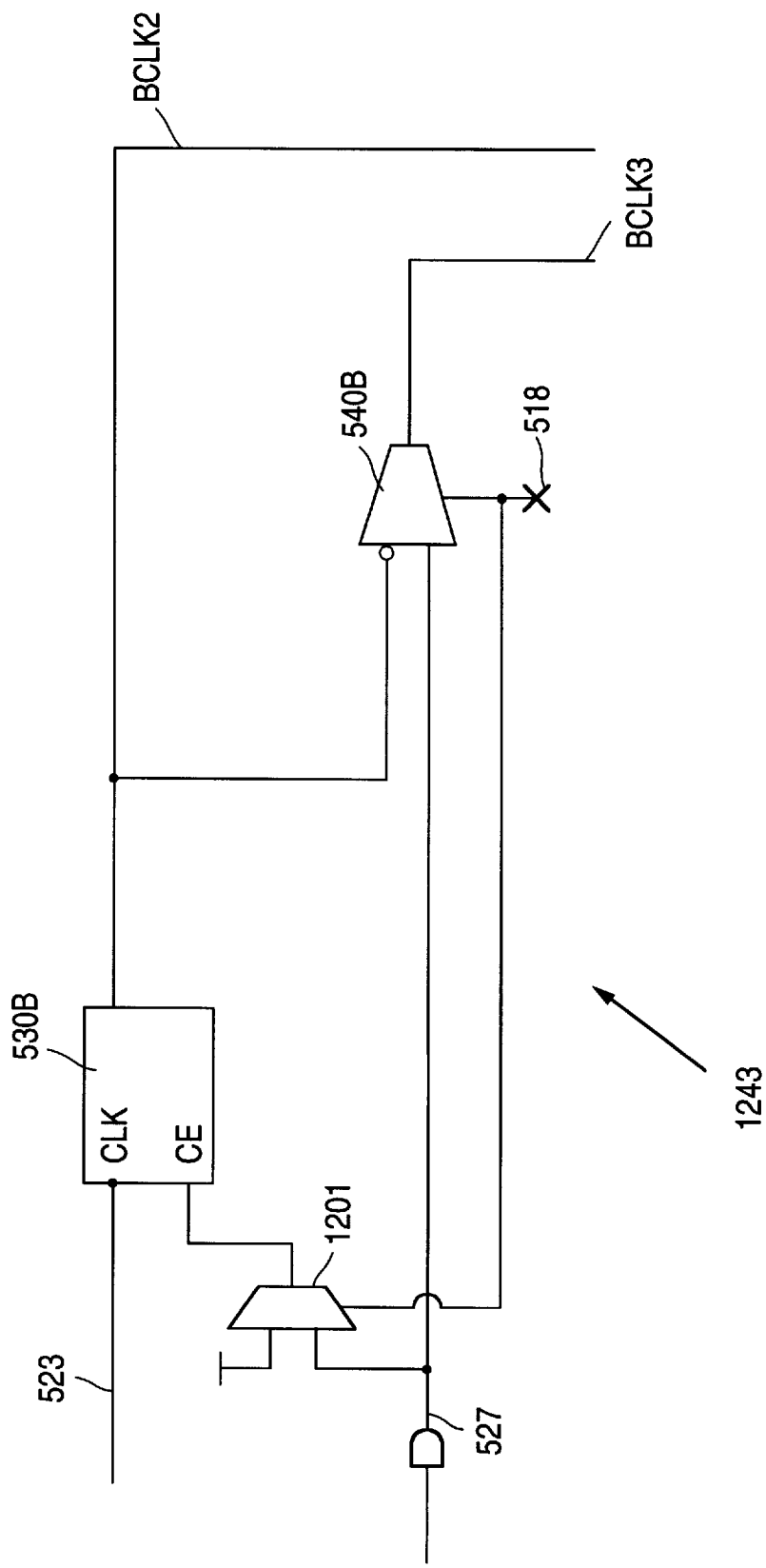
FIG. 12 is an alternative embodiment of the dual output multi-function clock generation circuit.

FIG. 12 is another embodiment of a dual output multi-function clock generation circuit 1243 that receives an input clock signal on clock input line 523 and product term 527. Dual output multi-function clock generation circuit 1243 can be substituted for dual output multi-function clock generation circuit 543 in FIG. 5C. Dual output multi-function clock generation circuit 1243 generates a first clock signal on block clock line BCLK2, and a second clock signal on block clock line BCLK3. The clock signals on block clock lines BCLK2 and BCLK3 are orthogonal to clock signals on block clock lines BCLK0 and BCLK1, but are not necessarily orthogonal to each other.

In this embodiment, dual output multi-function clock generation circuit 1243 generates, as explained more completely below, on block clock line BCLK2 any one of:
 i) an orthogonal block-level clock signal; and
 ii) an orthogonal block-level clock signal with either a static clock enable or a dynamic clock enable; and
Dual output multi-function clock generation circuit 1243 also generates, as explained more completely below, on block clock line BCLK3 any one of:

i) an orthogonal block-level clock signal that has a polarity opposite the clock signal on block clock line BCLK2;

ii) an orthogonal block-level clock signal, that has a polarity opposite the clock signal on block clock line BCLK2 with clock enable; and iii) a block-level product-term clock signal.

In this embodiment of dual output multi-function clock generation circuit 1243, clock input line 523 from programmable multiplexer 503 is connected to a clock terminal CLK of clock generator circuit 530B. A clock enable terminal CE of clock generator circuit 530B is connected to an output terminal of a programmable two-to-one multiplexer 1201. A first input terminal of multiplexer 1201 is connected to a logic one voltage source. A second input terminal of multiplexer 1201 is connected to fourth product term 527 in the plurality of logic signal lines 420*i*. A clock pulse is generated on output line BCLK2 of clock generator circuit 530B when the output signal of multiplexer 1201 has an active state, i.e., a first state, and the signal on clock input line 523 goes active. Effectively, the clock signal on input terminal CLK is passed through clock generator circuit 530B.

The signal passed through multiplexer 1201 is determined by the state of architectural cell 518. When product term 527 is connected to block clock line BCLK3 by programmable multiplexer 540B, the logic one signal is passed through multiplexer 1201 to clock enable terminal CE of clock generator 530B. Conversely, if product term 527 is not connected to block clock line BCLK3, product term 527 is passed through multiplexer 1201 to clock enable terminal CE of clock generator 530B. Thus, the clock enable function for clock generator 530B is dynamic when the product-term clock is not utilized and is static when the product-term clock is utilized. The other features of dual output multi-function clock generation circuit 1243 are the same as those described above for circuit 543, and that description is incorporated herein by reference.

The embodiments described above of the block clock generator and block initialization circuits of this invention are illustrative of the principles of this invention and are not intended to limit the invention to the particular embodiments described. For example, the above circuits used a common clock generator circuit. In another embodiment, different clock generator circuits could be used to provide different clock pulse characteristics for example. In view of this disclosure, those skilled in the art can implement the block clock generation and block initialization circuits in a wide variety of ways and in a wide variety of PLDs.

We claim:

1. In a programmable logic device having a plurality of programmable logic blocks, a block-level circuit comprising:

a plurality of product terms;

a plurality of clock signal input lines;

a plurality of block clock lines coupled to a plurality of macrocells in one programmable logic block;

a plurality of block initialization lines coupled to said plurality of macrocells in said one programmable logic block;

a block clock generator connected to a first set of product terms in said plurality of product terms, to clock signal input lines in said plurality of clock signal input lines, and to said plurality of block clock lines wherein said block clock generator receives input signals on said clock signal input lines and from said product terms, and generates at least one block clock signal on one of said plurality of block clock lines; and a block initialization circuit connected to a second set of product terms in said plurality of product terms, and to said plurality of block initialization lines wherein said block initialization circuit receives an input signal from said second set of product terms and generates an output signal on one of said plurality of block initialization lines.

2. In a programmable logic device having a plurality of programmable logic blocks, a block-level circuit comprising:

a plurality of product terms;

a plurality of clock signal input lines;

a plurality of block clock signal lines coupled to a plurality of macrocells in one programmable logic block in said plurality of programmable logic blocks;

a programmable clock and product-term clock generation circuit comprising:

a first generator circuit input terminal connected to one of said plurality of clock signal input lines;

a second generator circuit input terminal connected to one product term of said plurality of product terms; and a generator circuit output line wherein said generator circuit output line is one of said block clock lines in said plurality of block clock lines.

3. In a programmable logic device having a plurality of programmable logic blocks, a block-level circuit as in claim 2 wherein said programmable clock and product-term clock generation circuit further comprises:

a programmable polarity control element coupled to said first and second generator circuit input terminals to receive an input signal, and an output terminal connected to said generator circuit output line, where said polarity control element is programmably configurable to pass one of said input signal and an inverse of said input signal to said generator circuit output line.

4. In a programmable logic device having a plurality of programmable logic blocks, a block-level circuit as in claim 2 wherein said programmable logic device includes a plurality of said block-level circuits.

5. In a programmable logic device having a plurality of programmable logic blocks, a block-level circuit as in claim 4 wherein each programmable logic block in said programmable logic device includes a different one of said plurality of programmable block-level circuits.

6. In a programmable logic device having a plurality of programmable logic blocks, a block-level circuit as in claim 2 wherein said first generator circuit input terminal comprises a clock terminal of a clock generator circuit.

7. In a programmable logic device having a plurality of programmable logic blocks, a block-level circuit as in claim 2 wherein said second generator circuit input terminal comprises a clock enable terminal of a clock generator circuit.

8. In a programmable logic device having a plurality of programmable logic blocks, a block-level circuit as in claim 3 wherein said programmable clock and product-term clock generation circuit further comprises:

a programmable signal selector having:

a first selector input terminal coupled to said first generator circuit input terminal;

a second selector input terminal connected to said second generator circuit input terminal; and a selector output line connected to said programmable polarity control element to provide said input signal wherein said programmable signal selector selectively connects one selector input terminal to said selector output line, and disconnects one other selector input terminal from said selector output line.

9. In a programmable logic device having a plurality of programmable logic blocks, a block-level circuit as in claim 8 wherein said programmable clock and product-term clock generation circuit further comprises:
   a clock generator having:
      a clock terminal connected to said first generator circuit input terminal;
      a clock enable terminal connected to said second generator circuit input terminal; and
      an output terminal connected to said first selector input terminal wherein said clock generator generates a clock pulse on said output terminal only when a signal on said clock enable terminal has a first state.

10. In a programmable logic device as in claim 2, wherein said block-level circuit further comprises a programmable block initialization circuit comprising:
   a plurality of block initialization lines coupled to said plurality of macrocells in said one programmable logic block in said plurality of programmable logic blocks;
   a plurality of input terminals coupled to a set of product terms in said plurality of product terms;
   a first output terminal coupled to a first input terminal in said plurality of input terminals to receive the product term coupled to said first input terminal, and connected to a first block initialization line in said plurality of block initialization lines; and
   a second output terminal coupled to a second input terminal in said plurality of input terminals to receive one of the product term and the inverse of the product term coupled to the second input terminal, and connected to a second block initialization line in said plurality of block initialization lines.

11. In a programmable logic device having a plurality of programmable logic blocks, a block-level circuit comprising:
   a plurality of product terms;
   a plurality of clock signal input lines;
   a plurality of block clock signal lines coupled to a plurality of macrocells in a programmable logic block;
   a programmable clock and product-term clock generation circuit comprising:
      a clock generator having:
         a clock terminal coupled to one clock signal input line in said plurality of said clock signal input lines;
         a clock enable terminal coupled to one product term in said plurality of product terms; and
         a clock generator output terminal;
      a programmable clock signal selector having:
         a first selector input terminal coupled to said clock generator output terminal;
         a second selector input terminal coupled to said one product term in said plurality of product terms; and
         a selector output line
            wherein said programmable clock signal selector selectively connects one selector input terminal to selector output line, and disconnects one other selector input terminal from said selector line; and
      a programmable polarity control element having both a polarity input terminal and an inverse polarity input terminal connected to said selector output line; and a polarity output terminal connected to one of said block clock lines in said plurality of block clock lines
         wherein said programmable polarity control element programmably couples one of said polarity input terminal and said inverse polarity input terminal to said polarity output terminal and decouples the other of said polarity input terminal and said inverse polarity input terminal from said polarity output terminal.

12. In a programmable logic device having a plurality of programmable logic blocks, a block-level circuit as in claim 11 wherein said programmable logic device includes a plurality of said block-level circuits.

13. In a programmable logic device having a plurality of programmable logic blocks, a block-level circuit as in claim 12 wherein each programmable logic block in said programmable logic device includes a different one of said plurality of programmable block-level circuits.

14. In a programmable logic device having a plurality of programmable logic blocks as in claim 11, wherein said block-level circuit further comprises a programmable block initialization circuit comprising:
   a plurality of block initialization lines coupled to said plurality of macrocells in said one programmable logic block in said plurality of programmable logic blocks;
   a plurality of input terminals coupled to a set of product terms in said plurality of product terms;
   a first output terminal coupled to a first input terminal in said plurality of input terminals to receive the product term coupled to said first input terminal, and connected to a first block initialization line in said plurality of block initialization lines; and
   a second output terminal coupled to a second input terminal in said plurality of input terminals to receive one of the product term and the inverse of the product term coupled to the second input terminal, and connected to a second block initialization line in said plurality of block initialization lines.

15. A method of generating a block clock signal comprising:
   coupling a clock signal source having first and second edges to an input terminal of a clock generation circuit wherein said clock generation circuit also comprises a first clock enable terminal, a second clock enable terminal, and an output terminal;
   coupling a first product term to said first clock enable terminal wherein upon said first product term having a first state, a clock pulse is generated on said output terminal in response to each first edge on said input terminal; and upon said first product term having a second state, no clock pulse is generated on said output terminal in response to each first edge on said input terminal; and
   coupling a second product term to said second clock enable terminal wherein upon said second product term having a first state, a clock pulse is generated on said output terminal in response to each second edge on said input terminal; and upon said second product term having a second state, no clock pulse is generated on said output terminal in response to each second edge on said input terminal.

16. A method as in claim 15 wherein said first product term is dedicated to said block clock generator.

17. A method as in claim 15 wherein said second product term is dedicated to said block clock generator.

18. A method as in claim 15 wherein said second product term and said first product term are dedicated to said block clock generator.

19. A method as in claim 15 further comprising coupling a single input signal to said first product term; and configuring said second product term to have said second state so that said clock generator functions as a clock enabled generator responsive to said first edges.

20. A method as in claim 15 further comprising coupling a plurality of input signals to said first product term; and configuring said second product term to have said second state so that said clock generator functions as a clock enabled generator responsive to said first edges.

21. A method as in claim 15 further comprising coupling a single input signal to said second product term; and configuring said first product term to have said second state so that said clock generator functions as a clock enabled generator responsive to said second edges.

22. A method as in claim 15 further comprising coupling a plurality of input signals to said second product term; and configuring said first product term to have said second state so that said clock generator functions as a clock enabled generator responsive to said second edges.

23. In a programmable logic device, a block-level circuit comprising:
   a product term;
   a clock signal input line;
   a plurality of block clock lines coupled to a plurality of macrocells in one programmable logic block in a plurality of programmable logic blocks;
   a programmable dual output clock generation circuit comprising:
      a first generation circuit input terminal connected to said clock signal input line;
      a second generation circuit input terminal coupled to said product term;
      a first generation circuit output terminal connected to a first block clock line in said plurality of block clock signal lines, and coupled to a second block clock signal line in said plurality of block clock signal lines.

24. In a programmable logic device, a block-level circuit as in claim 23 wherein said programmable logic device includes a plurality of said block-level circuits.

25. In a programmable logic device, a block-level circuit as in claim 24 wherein each programmable logic block in said programmable logic device includes a different one of said plurality of programmable block-level circuits.

26. In a programmable logic device, a block-level circuit as in claim 23 wherein said first generation circuit terminal comprises a clock terminal of a clock generator circuit.

27. In a programmable logic device, a block-level circuit as in claim 23 wherein said second generation circuit terminal comprises a clock enable terminal of a clock generator circuit.

28. In a programmable logic device, a block-level circuit as in claim 23 wherein said programmable dual output clock generation circuit further comprises:
   a programmable signal selector having:
      a first selector input terminal coupled to said first generation circuit input terminal;
      a second selector input terminal connected to second generation circuit input terminal; and
      a selector output line connected to said second block clock signal line wherein said programmable signal selector selectively connects one selector input terminal to said selector output line, and disconnects one other selector input terminal from said selector output line.

29. In a programmable logic device, a block-level circuit as in claim 28 wherein said programmable dual output clock generation circuit further comprises:
   a clock generator having:
      a clock terminal connected to said first generation circuit input terminal;
      a clock enable terminal connected to said second generation circuit input terminal; and
      a clock generator output terminal connected to said first selector input terminal and to said generation circuit output terminal, wherein said clock generator generates a clock pulse on said clock generator output terminal only when a signal on said clock enable terminal has a first state.

30. In a programmable logic device, a block-level circuit as in claim 23 wherein said programmable dual output clock generation circuit further comprises:
   a clock generator having:
      a clock terminal connected to said first generation circuit input terminal;
      a clock enable terminal connected to said second generation circuit input terminal; and
      a clock generator output terminal connected to said generation circuit output terminal wherein said clock generator generates a clock pulse on said clock generator output terminal only when a signal on said clock enable terminal has a first state.

31. In a programmable logic device, a block-level circuit as in claim 23 wherein said programmable dual output clock generation circuit further comprises:
   a inverter having:
      an inverter input terminal coupled to said first generation circuit input terminal; and
      an inverter output line connected to second block clock line.

32. In a programmable logic device, a block-level circuit as in claim 31 wherein said programmable dual output clock generation circuit further comprises:
   a clock generator having:
      a clock terminal connected to said first generation circuit input terminal;
      a clock enable terminal connected to said second generation circuit input terminal; and
      a clock generator output terminal connected to said inverter input terminal and to said generation circuit output terminal, wherein said clock generator generates a clock pulse on said clock generator output terminal only when a signal on said clock enable terminal has a first state.

33. In a programmable logic device, a block-level circuit as in claim 23 wherein said programmable dual output clock generation circuit further comprises:
   a first programmable polarity control element having both a polarity input terminal and an inverse polarity input terminal coupled to said first generation circuit input terminal; and a polarity output terminal connected to said first block clock line
      wherein said first programmable polarity control element programmably couples one of said polarity input terminal and said inverse polarity input terminal to said polarity output terminal and decouples the other of said polarity input terminal and said inverse polarity input terminal from said polarity output terminal.

34. In a programmable logic device, a block-level circuit as in claim 33 wherein said programmable dual output clock generation circuit further comprises:

a second programmable polarity control element having both a polarity input terminal and an inverse polarity input terminal coupled to said first generation circuit input terminal; and a polarity output terminal connected to said second block clock line
wherein said first programmable polarity control element programmably couples one of said polarity input terminal and said inverse polarity input terminal to said polarity output terminal and decouples the other of said polarity input terminal and said inverse polarity input terminal from said polarity output terminal.

35. In a programmable logic device, a block-level circuit as in claim 34 wherein said programmable dual output clock generation circuit further comprises:
a clock generator having:
a clock terminal connected to said first generation circuit input terminal;
a clock enable terminal connected to said second generation circuit input terminal; and
a clock generator output terminal connected to said polarity input terminal and said inverse polarity terminal of both said first and second programmable polarity control elements, wherein said clock generator generates a clock pulse on said clock generator output terminal only when a signal on said clock enable terminal has a first state.

36. In a programmable logic device as in claim 23, wherein said block-level circuit further comprises a programmable block initialization circuit comprising:
a plurality of block initialization lines coupled to said plurality of macrocells in said one programmable logic block in said plurality of programmable logic blocks;
a plurality of input terminals coupled to a set of product terms in said plurality of product terms;
a first output terminal coupled to a first input terminal in said plurality of input terminals to receive the product term coupled to said first input terminal, and connected to a first block initialization line in said plurality of block initialization lines; and
a second output terminal coupled to a second input terminal in said plurality of input terminals to receive one of the product term and the inverse of the product term coupled to the second input terminal, and connected to a second block initialization line in said plurality of block initialization lines.

37. A block-level circuit comprising:
a plurality of product term input lines;
a plurality of clock signal input lines;
a plurality of block clock lines coupled to a plurality of macrocells in one programmable logic block of a plurality of programmable logic blocks;
a programmable multi-function clock and product term clock generator circuit comprising:
a first input terminal connected to a first clock signal input line in said plurality of clock signal input lines;
a second input terminal connected to a first product term in said plurality of product term input lines; and
an output line wherein said output line is a first block clock line in said plurality of block clock lines; and
a dual enable biphase clock generator circuit comprising:
a first input terminal connected to a second clock signal input line in said plurality of clock signal input lines;
a second input terminal connected to a second product term in said plurality of product term input lines;

a third input terminal connected to a third product term in said plurality of product term input lines; and
an output line wherein said output line is a second block clock line in said plurality of block clock lines.

38. A block-level circuit as in claim 37 further comprising:
a dual output multi-function clock generation circuit comprising:
a first input terminal connected to a third clock signal input line in said plurality of clock signal input lines;
a second input terminal connected to a fourth product term in said plurality of product term input lines;
a first output line wherein said first output line is a third block clock line in said plurality of block clock lines; and
a second output line wherein said second output line is a fourth block clock line in said plurality of block clock lines.

39. A block-level circuit as in claim 37 wherein said first and second clock signal input lines are the same line.

40. A block-level circuit as in claim 37 further comprising a programmable block initialization circuit comprising:
a plurality of block initialization lines coupled to said plurality of macrocells in said one programmable logic block in said plurality of programmable logic blocks;
a plurality of input terminals coupled to a set of product terms in said plurality of product terms;
a first output terminal coupled to a first input terminal in said plurality of input terminals to receive the product term coupled to said first input terminal, and connected to a first block initialization line in said plurality of block initialization lines; and
a second output terminal coupled to a second input terminal in said plurality of input terminals to receive one of the product term and the inverse of the product term coupled to the second input terminal, and connected to a second block initialization line in said plurality of block initialization lines.

41. A block-level circuit comprising:
a plurality of product term input lines;
a plurality of clock signal input lines;
a plurality of block clock lines coupled to a plurality of macrocells in a programmable logic block;
a programmable multi-function clock and product-term clock generator circuit comprising:
a first input terminal connected to a first clock signal input line in said plurality of clock signal input lines;
a second input terminal connected to a first product term in said plurality of product term input lines; and
an output line wherein said output line is a first block clock line in said plurality of block clock lines; and
a dual output multi-function clock generation circuit comprising:
a first input terminal connected to a second clock signal input line in said plurality of clock signal input lines;
a second input terminal connected to a second product term in said plurality of product term input lines;
a first output line wherein said first output line is a second block clock line in said plurality of block clock lines; and
a second output line wherein said second output line is a third block clock line in said plurality of block clock lines.

42. A block-level circuit as in claim 41 further comprising a programmable block initialization circuit comprising:

a plurality of block initialization lines coupled to said plurality of macrocells in said one programmable logic block in said plurality of programmable logic blocks;

a plurality of input terminals coupled to a set of product terms in said plurality of product terms;

a first output terminal coupled to a first input terminal in said plurality of input terminals to receive the product term coupled to said first input terminal, and connected to a first block initialization line in said plurality of block initialization lines; and a second output terminal coupled to a second input terminal in said plurality of input terminals to receive one of the product term and the inverse of the product term coupled to the second input terminal, and connected to a second block initialization line in said plurality of block initialization lines.

43. A block-level circuit comprising:

a plurality of product term input lines;

a plurality of clock signal input lines;

a plurality of block clock lines coupled to a plurality of macrocells in a programmable logic block;

a dual enable biphase clock generator circuit comprising:
  a first input terminal connected to a first clock signal input line in said plurality of clock signal input lines;
  a second input terminal connected to a first product term in said plurality of product term input lines;
  a third input terminal connected to a second product term in said plurality of product term input lines; and
  an output line wherein said output line is a first block clock line in said plurality of block clock lines a dual output multi-function clock generation circuit comprising:
  a first input terminal connected to a second clock signal input line in said plurality of clock signal input lines;
  a second input terminal connected to a third product term in said plurality of product term input lines;
  a first output line wherein said first output line is a second block clock line in said plurality of block clock lines; and
  a second output line wherein said second output line is a third block clock line in said plurality of block clock lines.

44. A block-level circuit as in claim 43 further comprising a programmable block initialization circuit comprising:

a plurality of block initialization lines coupled to said plurality of macrocells in said one programmable logic block in said plurality of programmable logic blocks;

a plurality of input terminals coupled to a set of product terms in said plurality of product terms;

a first output terminal coupled to a first input terminal in said plurality of input terminals to receive the product term coupled to said first input terminal, and connected to a first block initialization line in said plurality of block initialization lines; and a second output terminal coupled to a second input terminal in said plurality of input terminals to receive one of the product term and the inverse of the product term coupled to the second input terminal, and connected to a second block initialization line in said plurality of block initialization lines.

45. A method for block clock signal generation comprising:

coupling a plurality of clock lines to a block-level circuit;

coupling a plurality of product terms to said block-level circuit;

programmably configuring said block-level circuit to generate a plurality of block clock signals in response to signals on said plurality of clock lines and said plurality of product terms wherein said plurality of block clock signals can include any of a product-term clock signal; a clock enabled clock signal; a sum-term clock signal; and a biphase clock signal.

46. A method as in claim 45 wherein at least a set of said plurality of block clock signals are orthogonal block clock signals.

47. A method for block clock signal generation comprising:

coupling a plurality of clock lines to a block-level circuit;

coupling a plurality of product terms to said block-level circuit;

programmably configuring said block-level circuit to generate a plurality of block clock signals in response to signals on said plurality of clock lines and said plurality of product terms wherein said plurality of block clock signals can include any one of a product-term clock signal; and a clock enabled clock signal.

48. A method for block clock signal generation comprising:

coupling a plurality of clock lines to a block-level circuit;

coupling a plurality of product terms to said block-level circuit;

generating from said block-level circuit a plurality of block-level clock signals in response to at least one signal on said plurality of clock lines and said plurality of product terms wherein said plurality of block-level clock signals can include any one of a product-term clock signal; a clock enabled clock signal; and a biphase clock signal.

49. A method for block clock signal generation comprising:

coupling a plurality of clock lines to a block-level circuit;

coupling a plurality of product terms to said block-level circuit;

generating from said block-level circuit a plurality of block-level clock signals in response to at least one signal on said plurality of clock lines and said plurality of product terms wherein said plurality of block-level clock signals can include any one of a sum-term clock signal; a clock enabled clock signal; and a biphase clock signal.

50. In a programmable logic device, a block-level circuit comprising:

a plurality of product terms;

a plurality of block initialization lines coupled to a plurality of macrocells in one programmable logic block in a plurality of programmable logic blocks;

a programmable initialization circuit comprising:
  a plurality of input terminals coupled to said plurality of product terms;
  a first output terminal coupled to a first input terminal in said plurality of input terminals to receive the product term coupled to said first input terminal, and connected to a first block initialization line in said plurality of block initialization lines; and
  a second output terminal coupled to a second input terminal in said plurality of input terminals to receive one of the product term and the inverse of the product term coupled to the second input terminal, and connected to a second block initialization line in said plurality of block initialization lines.

* * * * *